(12) United States Patent
Wang et al.

(10) Patent No.: US 7,535,372 B2
(45) Date of Patent: May 19, 2009

(54) METHOD FOR MEASURING THE OPERATING STATE OF A SYNCHRONOUS MOTOR USING COMPOSITE POWER ANGLE METER

(76) Inventors: Zhaolei Wang, Operating Department, Qin Bei Power Plant of Huaneng, Wulongkou County, Jiyuan City, Henan Province (CN) 454662; Zexi Hua, Operating Department, Qin Bei Power Plant of Huaneng, Wulongkou County, Jiyuan City, Henan Province (CN) 454662

( * ) Notice: Subject to any disclaimer, the term of this patent is extended or adjusted under 35 U.S.C. 154(b) by 272 days.

(21) Appl. No.: 10/585,150

(22) PCT Filed: Dec. 31, 2003

(86) PCT No.: PCT/CN03/01153

§ 371 (c)(1),
(2), (4) Date: Jun. 29, 2006

(87) PCT Pub. No.: WO2005/066648

PCT Pub. Date: Jul. 21, 2005

(65) Prior Publication Data

US 2007/0168141 A1 Jul. 19, 2007

(51) Int. Cl.
*G08B 21/00* (2006.01)
(52) U.S. Cl. .................. 340/648; 340/679; 702/183; 324/772
(58) Field of Classification Search .......... 340/648, 340/679; 702/60, 182, 183, 57, 58, 59; 324/772, 324/545, 546
See application file for complete search history.

(56) References Cited

U.S. PATENT DOCUMENTS

| 5,990,592 | A | * | 11/1999 | Miura et al. ........... 310/156.53 |
| 6,035,265 | A | * | 3/2000 | Dister et al. ................. 702/183 |
| 6,147,454 | A | * | 11/2000 | Uchida et al. .................. 315/85 |
| 6,515,446 | B1 | * | 2/2003 | Koide et al. .................. 318/700 |

FOREIGN PATENT DOCUMENTS

| CN | 2427813 | 4/2001 |
| CN | 2476034 Y | 6/2002 |
| CN | 2516981 Y | 10/2002 |
| JP | 2002357548 | 12/2002 |

* cited by examiner

*Primary Examiner*—Anh V La
(74) *Attorney, Agent, or Firm*—Boyle Fredrickson, S.C.

(57) ABSTRACT

The present invention discloses a method for measuring the operating state of synchronous motor by using composite power angle meter, the method comprising steps of: a) obtaining various signals of the synchronous motor and its system; b) converting the electric signals into digital signals by an internal data collection part of the composite power angle meter, and inputting all the digital signals to a host computer; c) inputting related parameters or commands to the host computer by keyboard and mouse; d) calculating the related data of the motor according to a program by the host computer, obtaining the coordinates of relevant points and related data, and inputting the results to a displaying program; e) processing the coordinates of main points and the calculation results by the displaying program in the host computer, and displaying on a display a dynamic composite power angle graph and the motor-end composite magnetic leakage graph which vary with the motor's parameters. The method provided by the present invention may intuitionally reflect the operating state of the synchronous motor from both electric and mechanical aspects, and also reflect the situation of the composite magnetic leakage at the synchronous motor end.

6 Claims, 7 Drawing Sheets

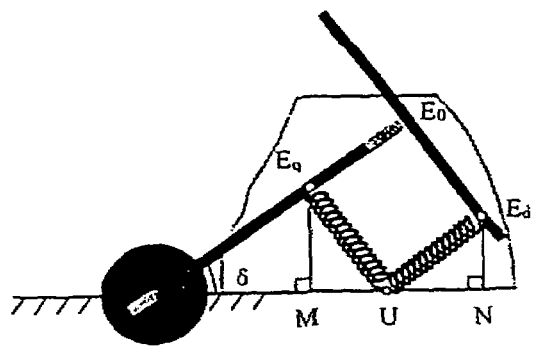
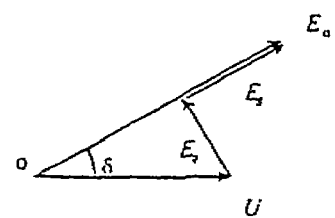
Fig.5              Fig.6
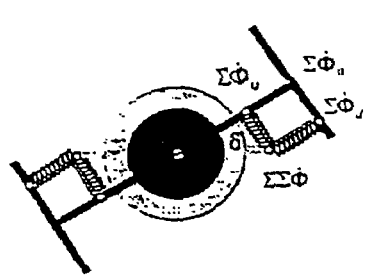
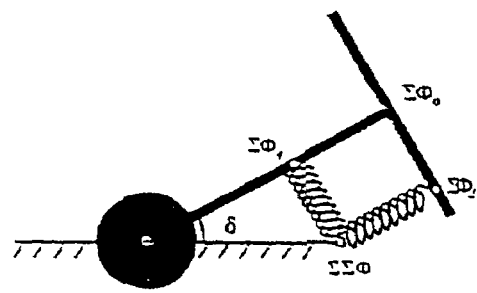
Fig.7              Fig.8
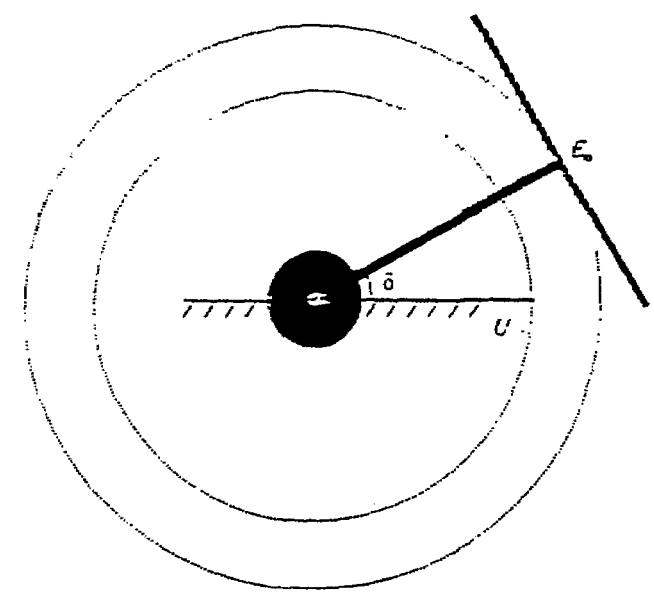
Fig.9

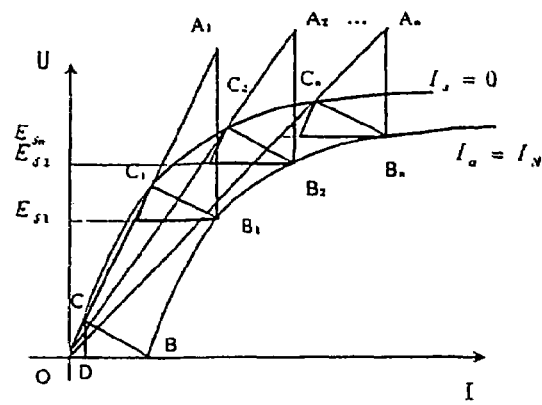
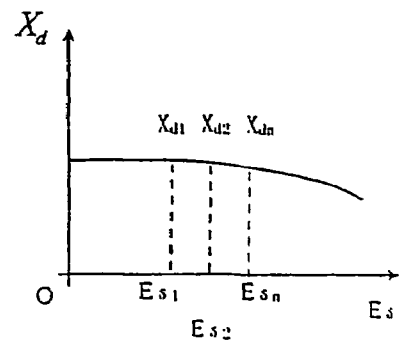
Fig.12          Fig.13
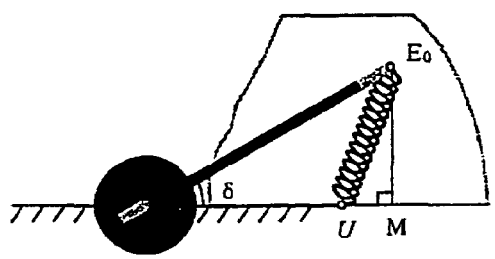
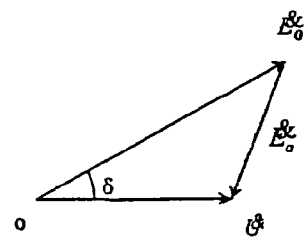
Fig.14          Fig.15
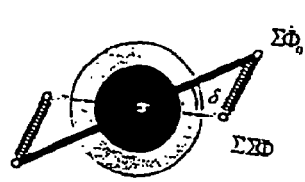
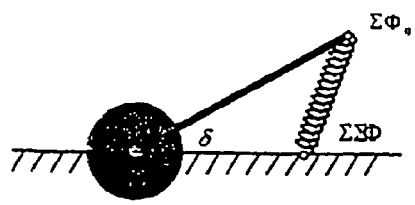
Fig.16          Fig.17

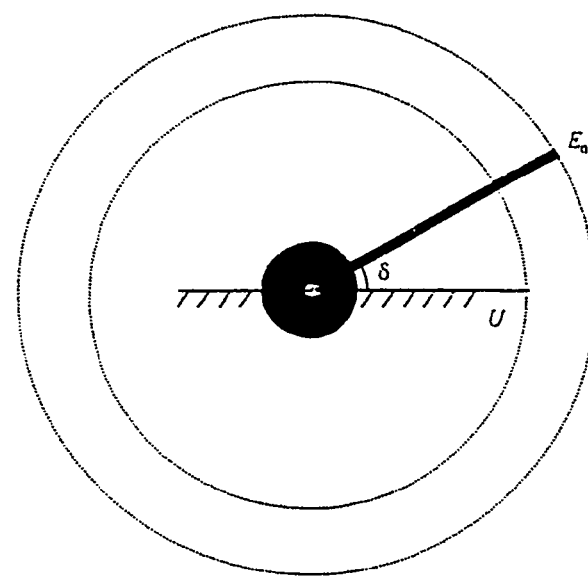
Fig.18
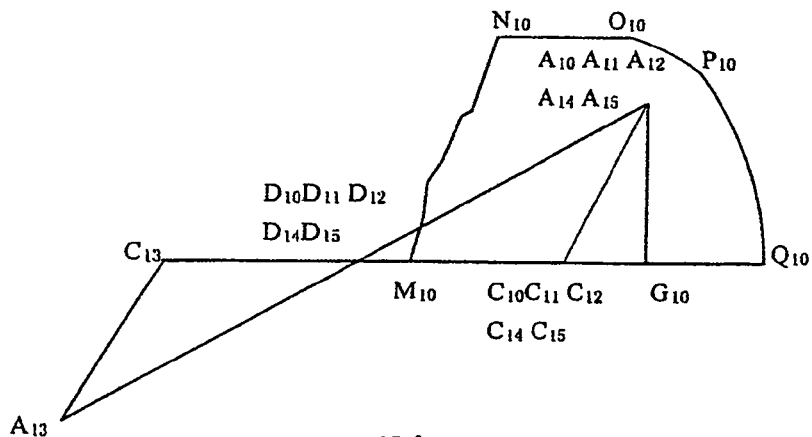
Fig.19
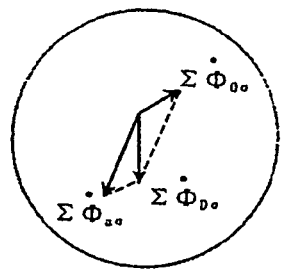 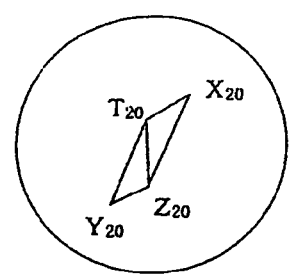
Fig.20  Fig.21

METHOD FOR MEASURING THE OPERATING STATE OF A SYNCHRONOUS MOTOR USING COMPOSITE POWER ANGLE METER

FIELD OF THE INVENTION

The present invention relates to a method for measuring the operating state of synchronous motor by using composite power angle meter, which belongs to the field of electrical engineering in electric power systems.

BACKGROUND OF THE INVENTION

In the industrial practice of electric power systems, it is necessary to constantly monitor the operating state of a synchronous motor, so as to ensure the synchronous motor to operate in an optimum state. At present, an electric power system generally adopts, at operating locales, various types of meters to display the current, voltage, power and other related electric data of the synchronous motor, especially adopts a power angle meter to measure the power angle and other related electric data of the synchronous motor, and displays the electric power angle vector graph of the synchronous motor through a TV screen (as shown in FIGS. 6 and 15), so as to provide intuitional electric vector graph for operators.

However, there are disadvantages in various electric measuring meters currently in use. For example, the defects of the power angle meter which is capable of displaying the electric data and electric vector graph of a salient-pole synchronous motor are:

1. The power angle meter can only display the electric power angle vector graph of the synchronous motor (as shown in FIG. 6), but it cannot directly display the mechanical relationship between the stator and the rotor of the synchronous motor.

2. Although the power angle meter can display the electric power angle vector graph of the synchronous motor and reflect the stator armature potential, magnetic excitation potential, motor-end voltage, power angle and other electric data of the synchronous motor, it cannot display, with optimum segments, the magnitudes of active power and reactive power of the synchronous motor or the magnitudes of active components and reactive components of other parameters of the synchronous motor.

3. The power angle meter cannot satisfy the requirements of various professionals working in synchronous motor monitoring and operating. With the development of electric technology, a majority of dynamotor sets in the power plants realize the centralized control by programs. Compared with the number of other professionals, the number of electric professionals working in dynamotor monitoring and operating is less and less. However, it is difficult for non-electric professionals to understand the electric power angle vector graph displayed by the power angle meter of the synchronous motor.

4. The power angle meter cannot be applied to synchronous parallel-network monitoring of the synchronous motor.

5. The power angle meter cannot display the end magnetic leakage condition of the synchronous motor.

SUMMARY OF THE INVENTION

Accordingly, an object of the present invention aims at providing a method for measuring the operating state of a synchronous motor by using composite power angle meter. The method can intuitionally reflect various operating states of a synchronous motor from both electric and mechanical aspects, is advantageous for operators of various specialties to dialectically understand the operation principle of the synchronous motor from both electric and mechanical aspects, provides an intuitional model for mechanical analysis of the parallel-network operating state of the synchronous motor, and provides operators with images for analyzing and monitoring the end heat-emitting condition of the synchronous motor by depicting the end composite magnetic leakage graph of the synchronous motor.

In order to achieve the above object, one aspect of the present invention provides a method for measuring the operating state of synchronous motor by using composite power angle meter, which comprises steps of:

a) Obtaining various electric signals of the synchronous motor and its system, and obtaining digital signals of related equipments;

b) Converting the electric signals into digital signals by an internal data collection part of the composite power angle meter, and inputting related digital signals to a host computer;

c) Inputting related parameters or commands to the host computer by keyboard and mouse;

d) Program-processing the related data by the computer, calculating the data by a computing program to obtain the coordinates of relevant points and related data, and inputting the results to a displaying program;

e) Using the coordinates of main points and the calculation results to depict various electric and mechanical model graphs of the synchronous motor through the displaying program process by the computer, displaying on a display a dynamic composite power angle graph which varies with the motor's parameters, and realizing an alarm function;

f) Using the coordinates of main points and the calculation results to depict the end composite magnetic leakage graph of the synchronous motor through the displaying program process by the computer, displaying on a display an end composite magnetic leakage graph of the synchronous motor which varies with the motor's parameters, and realizing an alarm function.

The present invention provides a method for measuring the operating state of a synchronous motor by using composite power angle meter, wherein program processes comprise a displaying program process and a computing program process; the displaying program process comprises establishing graph coordinates and imaging; and the computing program process comprises determining parameters, calculating parameters and alarming.

The above aspect of the present invention uses a composite power angle meter to obtain the stator voltage and current signals, magnetic excitation voltage and current signals, magnetic excitation adjustment signal and system voltage signal of the synchronous motor in real time, performs internal controlling programs to calculate the related parameters of the synchronous motor in real time, depicts the electric and mechanical model graphs illustrating various characteristics of the synchronous motor, depicts the end composite magnetic leakage graph of the synchronous motor, and displays the graphs on a display. Therefore, compared with conventional methods for measuring the operating state of a synchronous motor by using power angle meter, the present invention has the following advantages:

1. The present invention may intuitionally reflect the operating state of a synchronous motor from both electric and mechanical aspects. The present invention may not only display the electric power angle vector graph of the synchronous motor, but also display the composite power angle graph, motor mechanical model graph, motor mechanical model schematic graph and motor synchronous composite power angle graph of the synchronous motor. Compared with the graphs displayed by conventional power angle meters, the present invention can additionally display the following mechanical models: the rigid bodies of rotor and stator of the synchronous motor, the levers and springs of rotor and stator of the synchronous motor, and etc.

2. Compared with the electric vector graph of the synchronous motor, the composite power angle graph of the synchronous motor, which is depicted for measuring the operating state of the synchronous motor by the present invention, adds mechanical model graphs of the synchronous motor and also adds the assistant lines of $E_qM$ and $E_dN$, is easier to illustrate the power distribution, active and reactive components of stator voltage, active and reactive components of stator current, and active and reactive components of spring pull of the synchronous motor, and can also illustrate the magnitude of the variance of the magnetic excitation adjustment signal.

3. The motor operating state graphs depicted for measuring the operating state of the synchronous motor by using the composite power angle meter of the present invention are advantageous for operators of various specialties to dialectically understand the operation principle of the synchronous motor from both electric and mechanical aspects, provide intuitional models for mechanical analysis of parallel-network operating state of the synchronous motor, and may be effective tools for the magnetic excitation characteristics analysis, magnetic excitation adjustment, synchronous parallel-network, and operation monitoring and controlling of the synchronous motor.

4. The synchronous power angle graph of the synchronous motor depicted by the present invention may be applied in synchronous parallel-network monitoring of the synchronous motor.

5. The end composite magnetic leakage graph of the synchronous motor depicted by the present invention may be applied to analyze and monitor the end heat-emitting condition of the synchronous motor.

DETAILED DESCRIPTION OF THE DRAWINGS

FIG. 5 is a composite power angle graph depicted for measuring the operating state of a salient-pole synchronous motor by using the composite power angle meter according to the present invention;

FIG. 6 is an electric power angle vector graph, namely sub-figure I of the composite power angle graph depicted for measuring the operating state of the salient-pole synchronous motor by using the composite power angle meter according to the present invention;

FIG. 7 is a motor mechanical model graph, namely sub-figure II of the composite power angle graph depicted for measuring the operating state of the salient-pole synchronous motor by using the composite power angle meter according to the present invention;

FIG. 8 is a motor mechanical model schematic graph, namely sub-figure III of the composite power angle graph depicted for measuring the operating state of the salient-pole synchronous motor by using the composite power angle meter according to the present invention;

FIG. 9 is a synchronous composite power angle graph, namely sub-figure IV of the composite power angle graph depicted for measuring the operating state of the salient-pole synchronous motor by using the composite power angle meter according to the present invention;

FIG. 12 is a graph illustrating curves of a zero load and a zero power factor of a dynamotor;

FIG. 13 is a graph illustrating the relationship between the air gap potential and the saturated reactance of the dynamotor;

FIG. 14 is a composite power angle graph depicted for measuring the operating state of a non-salient-pole synchronous motor by using the composite power angle meter according to the present invention;

FIG. 15 is an electric power angle vector graph, namely sub-figure I of the composite power angle graph depicted for measuring the operating state of the non-salient-pole synchronous motor by using the composite power angle meter according to the present invention;

FIG. 16 is a motor mechanical model graph, namely sub-figure II of the composite power angle graph depicted for measuring the operating state of the non-salient-pole synchronous motor by using the composite power angle meter according to the present invention;

FIG. 17 is a motor mechanical model schematic graph, namely sub-figure III of the composite power angle graph depicted for measuring the operating state of the non-salient-pole synchronous motor by using the composite power angle meter according to the present invention;

FIG. 18 is a synchronous composite power angle graph, namely sub-figure IV of the composite power angle graph depicted for measuring the operating state of the non-salient-pole synchronous motor by using the composite power angle meter according to the present invention;

FIG. 19 shows a coordinates model of the power angle graph of the non-salient-pole synchronous motor, which is established for measuring the operating state of the non-salient-pole synchronous motor by using the composite power angle meter according to the present invention;

FIG. 20 is a motor-end composite magnetic leakage graph depicted for measuring the operating state of the salient-pole synchronous motor by using the composite power angle meter according to the present invention;

FIG. 21 shows a motor-end composite magnetic leakage coordinates model established for measuring the operating state of the salient-pole synchronous motor by using the composite power angle meter according to the present invention;

Figure 22:
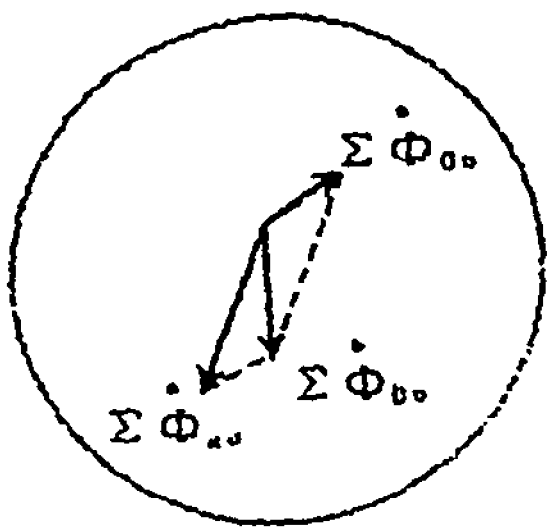
Figure 23:
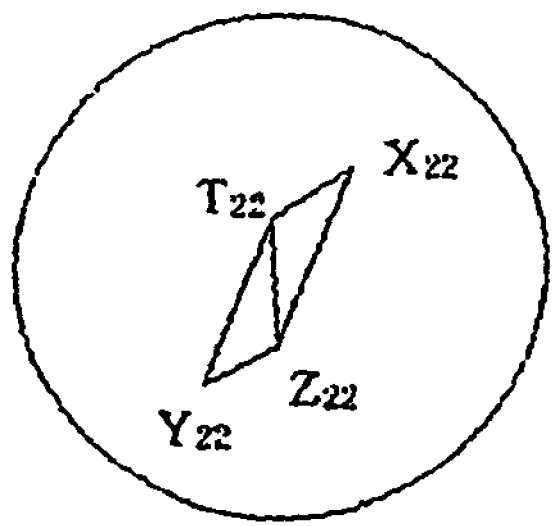

FIG. 22 is a motor-end composite magnetic leakage graph depicted for measuring the operating state of the non-salient-pole synchronous motor by using the composite power angle meter according to the present invention; and FIG. 23 shows a motor-end composite magnetic leakage coordinates model established for measuring the operating state of the non-salient-pole synchronous motor by using the composite power angle meter according to the present invention.

DETAILED DESCRIPTION OF THE INVENTION

Figure 1:
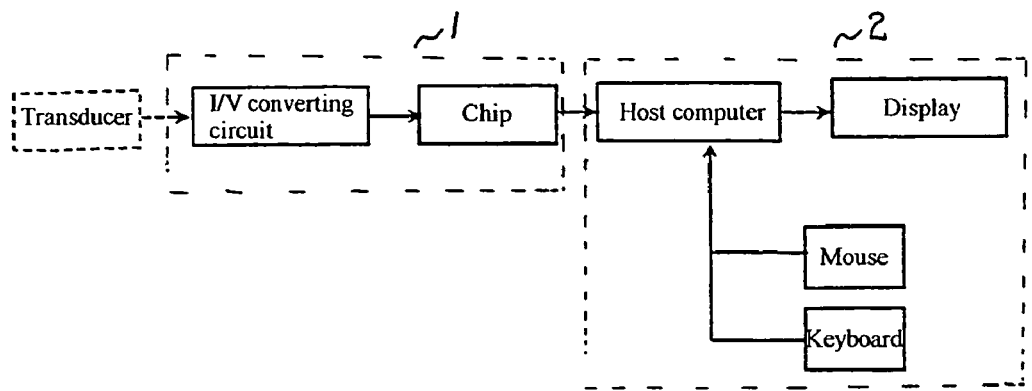
FIG. 1 is a schematic diagram illustrating the configuration of the composite power angle meter according to the present invention.

As shown in FIG. 1, the composite power angle meter of the present invention consists of a data collection part 1 and a computer equipment 2. The data collection part 1 performs electric signal collecting and digital signal collecting. The electric signal collecting adopts an I/V converting circuit and an A/D conversion chip, the function of which is to collect various electric signals regarding the synchronous motor, convert the electric signals into digital signals, and transfer the digital signals to the computer 2. The digital signal collecting collects digital signals of related equipments and transfers them to the computer 2. The host computer 2 stores an image displaying program and a computing program. According to the computing program, the host computer 2 performs computing on the related parameters of the synchronous motor to obtain the coordinates of related points and related data of the image, and inputs the results into the displaying program. The computer processes the coordinates of main points and the calculation results by the displaying program, displays on a display of the computer an electric model graph, a mechanical model graph and a dynamic composite power angle graph which vary with the motor's parameters and represent the operating state of the synchronous motor as well as the end composite magnetic leakage graph of the synchronous motor, and realizes the alarm function.

Figure 2:
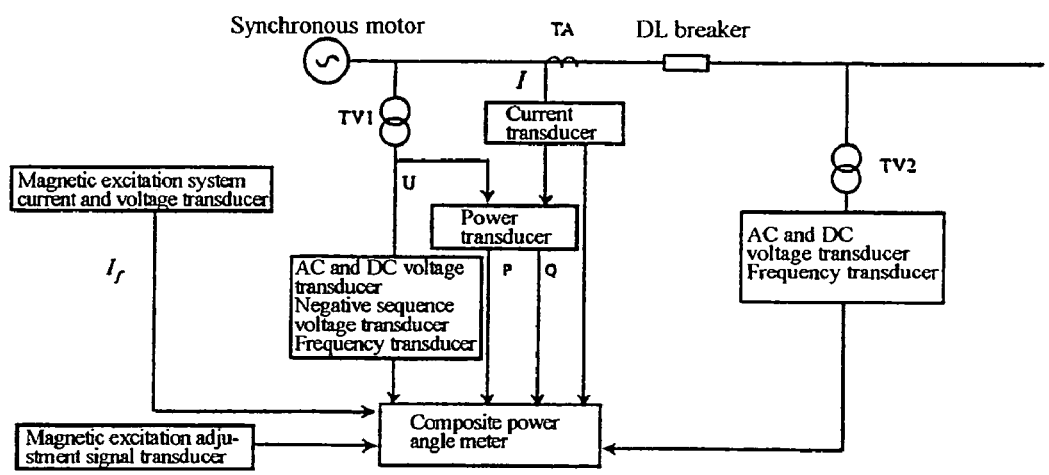
FIG. 2 is a diagram illustrating the external connection relationship of the composite power angle meter according to the present invention.

As shown in FIG. 2, the composite power angle meter of the present invention is connected with the measuring devices of the electric power system through wires, and receives the electric signals outputted from the synchronous motor and the measuring devices of the electric power system (i.e. transducers), as listed in Table 1. When the electric power system may provide usable digital signals, the corresponding electric signal collecting circuit may be omitted, and the corresponding parameters can be obtained by the digital signal collecting.

TABLE 1

Electric signals received by and outputted from electric parameter transducers

| Transducer | Signal source | Electric signal (Received signal) | Outputted signal |
|---|---|---|---|
| DC voltage transducer | Synchronous motor exit TV1 | Motor-end three phase line voltage $U_{AB} U_{BC} U_{CA}$ | Motor-end three phase line voltage $u_{AB} u_{BC} u_{CA}$ |
|  | System TV2 | System three phase line voltage $U_{XAB} U_{XBC} U_{XCA}$ | System three phase line voltage $u_{XAB} u_{XBC} u_{XCA}$ |
|  | Synchronous motor exciter | Magnetic excitation voltage, and operating excitation voltage and backup excitation voltage thereof $U_L U_G U_B$ | Magnetic excitation voltage, and operating excitation voltage and backup excitation voltage thereof $u_L u_G u_B$ |
|  | Switch state signal, switching off low potential, switching on high potential | Magnetic excitation system and synchronous motor exit switch state signal $U_{ZG} U_{ZB} U_{DL}$ | Magnetic excitation system and synchronous motor exit switch state signal $u_{ZG} u_{ZB} u_{DL}$ |
|  | Exciter adjustment unit | Magnetic excitation adjustment signal $U_1 U_2 \ldots U_n$ | Magnetic excitation adjustment signal $u_1 u_2 \ldots u_n$ |
| DC current transducer | synchronous motor exciter | Magnetic excitation current, and operating excitation current and backup excitation current thereof $I_L I_G I_{BY}$ | Magnetic excitation current, and operating excitation current and backup excitation current thereof $i_L i_G i_{BY}$ |
| AC voltage transducer | Synchronous motor exit TV1 | Motor-end three phase line voltage $U_{AB} U_{BC} U_{CA}$ | Motor-end three phase line voltage effective value $U_{ab} U_{bc} U_{ca}$ |
|  | System TV2 | System three phase line voltage $U_{XAB} U_{XBC} U_{XCA}$ | System three phase line voltage effective value $U_{xab} U_{xbc} U_{xca}$ |
| AC current transducer | Synchronous motor exit TA | Motro-end three phase current $I_A I_B I_C$ | Motro-end three phase curent effective value $I_a I_b I_c$ |
| Power transducer | Synchronous motor exit TV1 | Motor-end line voltage $U_{AB} U_{BC} U_{CA}$ | Synchronous motor active power P |
|  | Synchronous motor exit TA | Motor-end current $I_A I_B I_C$ | Synchronous motor reactive power Q |
| Frequency transducer | Synchronous motor exit TV1 | Motor-end line voltage $U_{AB}$ | Motor-end voltage frequency $f$ |
|  | System TV2 | System line voltage $U_{XAB}$ | System voltage frequency $f_x$ |

TABLE 1-continued

Electric signals received by and outputted from electric parameter transducers

| Transducer | Received signal | | Outputted signal |
|---|---|---|---|
| | Signal source | Electric signal | |
| negative sequence voltage transducer | Synchronous motor exit TV1 | Motor-end three phase line voltage $U_{AB}$ $U_{BC}$ $U_{CA}$ | Synchronous motor negative sequence voltage $U_F$ |

Figure 3:
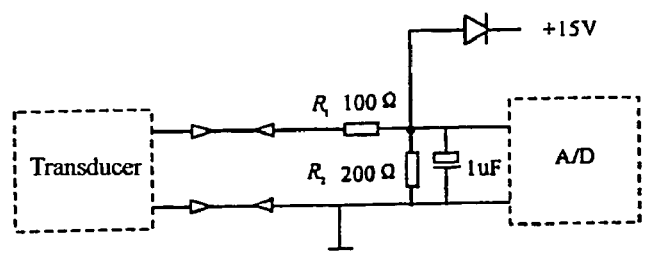
FIG. 3 is a diagram illustrating the operation principle of the I/V converting circuit of the composite power angle meter according to the present invention.
Figure 4:
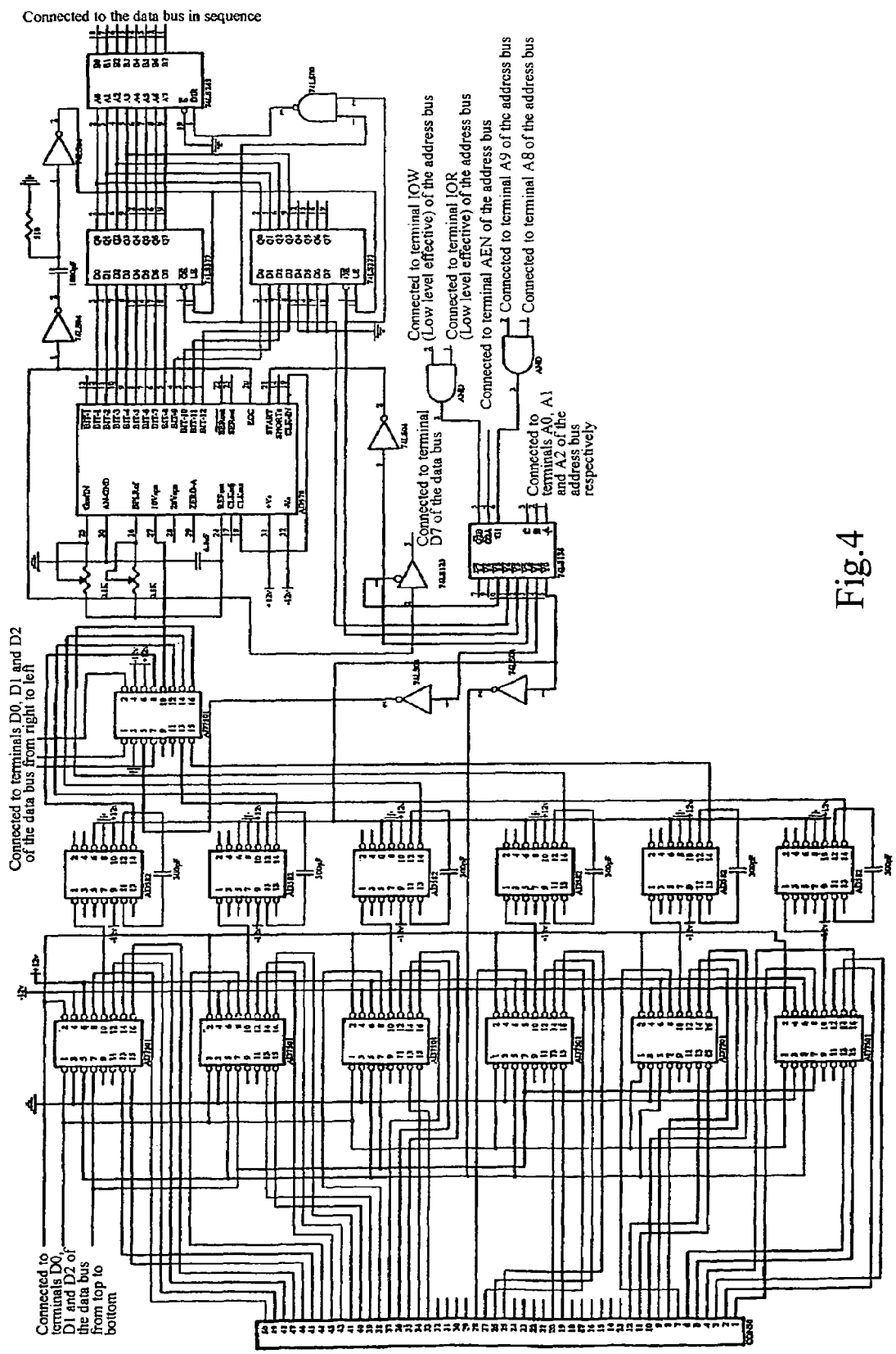
FIG. 4 is a diagram illustrating a detailed circuitry of the data collection part of the composite power angle meter according to the present invention.

The operation of the electric signal data collecting part of the composite power angle meter mainly comprises three steps of:

1. Receiving motor signals by various electric parameter transducers and converting the signals into analogue current signals of 0–±20 mA.
2. Converting the current signals outputted from the electric parameter transducers into voltage signals of 0–±5V by the I/V converting circuit.
3. Inputting the voltage signals of 0–±5V to a data collecting interface card, A/D converting the signals into digital data and storing them in a memory of the computer. FIG. 3 illustrates the operation principle of the I/V converting circuit. When the current signals outputted from the transducer pass through resistances $R_1$ and $R_2$, the voltage signals of 0–±5V across $R_2$ are transferred to an A/D conversion device.
4. FIG. 4 is a diagram illustrating the operation principle of the A/D conversion device in the data collection system. The main technical requirements are:

a. obtaining the instantaneous values of the motor-end voltage and system voltage at the same time, and storing them in the memory of the computer to perform calculation;

That is, the A/D conversion device of the data collection system needs to input the motor-end three phase instantaneous line voltage $u_{AB}$, $u_{BC}$, $u_{CA}$ and the system three phase instantaneous line voltage $u_{XAB}$, $u_{XBC}$, $u_{XCA}$ at the same time to the computer, and the computer performs calculation on each group of the instantaneous voltages.

b. The A/D conversion device may collect sufficient signals, and redundant samples may be used as the backup for temporary sampling increments.

The composite power angle meter digitizes the inputted electric signals by an A/D chip, and inputs the digitized signals to the host computer through COM or LPT. The host computer performs the computing program process and displaying program process on the inputted signals, and depicts the graph illustrating the operating state of the synchronous motor.

When the required calculation can be obtained from other equipments, the electric parameter collection circuit and the computing process may be omitted.

The method for measuring the operating state of the synchronous motor by using the composite power angle meter of the present invention comprises the steps of:

1. obtaining the stator voltage and current signals, magnetic excitation voltage and current signals, magnetic excitation adjustment signal, system voltage and current signals of the synchronous motor, as well as the state signals of the exit switch of the synchronous motor and its magnetic excitation circuit switch;
2. receiving the related digital signals and electric signals by the data collection part, digitizing the electric signals, and inputting the obtained digital signals to the host computer;
3. inputting the related parameters or commands to the host computer by keyboard and mouse;
4. performing calculation on the related parameters of the motor and performing the computing program process on the related data by the host computer; after the computing program process, inputting the obtained data to the displaying program to determine instantaneous coordinates of the main points;
5. using the coordinates of the main points to depict various electric and mechanical model graphs of the synchronous motor through the displaying program process by the host computer, and displaying on the display a dynamic composite power angle graph of the synchronous motor and the end composite magnetic leakage graph of the synchronous motor which vary with the motor's parameters.

In terms of different shapes of the motor rotor, synchronous motors may be classified as two classifications of salient-pole synchronous motors and non-salient-pole synchronous motors. Accordingly, composite power angle meters of synchronous motor may be classified as composite power angle meters of salient-pole synchronous motor and composite power angle meters of non-salient-pole synchronous motor.

With reference to the different types of synchronous motors, the methods for measuring the different types of motors by using the composite power angle meters will now be described in detail.

I. The method for measuring the operating state of the salient-pole synchronous motor by using the composite power angle meter comprises steps of:

1. Obtaining the stator voltage and current signals, magnetic excitation voltage and current signals, magnetic excitation adjustment signal and system voltage signal of the synchronous motor as well as the state signals of the exit switch of the synchronous motor and its magnetic excitation circuit switch through the external wires of the composite power angle meter.
2. Converting the related electric signals into digital signals through the A/D conversion chip of the data collection part of the composite power angle meter, inputting the chip-converted digital signals and the received digital signals to the host computer through COM or LPT, and performing program process on the inputted signals by the computer.
3. Inputting the related parameters or commands to the host computer by keyboard and mouse.
4. Performing the program process on the above data by the host computer.

The program process comprises two parts of displaying program and computing program, the gist of which are listed below:

1) The Gist of the Displaying Program (1) Establishing Image Coordinates

Figure 10:
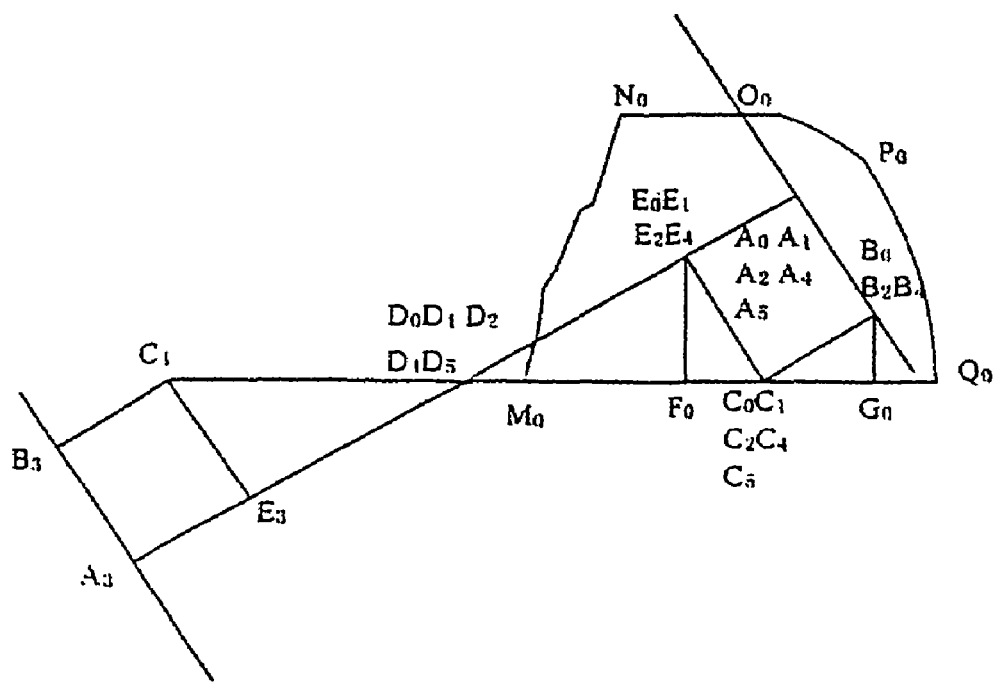
FIG. 10 shows a coordinates model of the power angle graph of the salient-pole synchronous motor, which is established for measuring the operating state of the salient-pole synchronous motor by using the composite power angle meter according to the present invention.

The composite power angle meter of the salient-pole synchronous motor can display six kinds of graphs, which respectively are: composite power angle graph of salient-pole synchronous motor, as shown in FIG. 5; electric power angle vector graph, namely sub-figure I of the composite power angle graph of the salient-pole synchronous motor, as shown in FIG. 6; motor mechanical model graph, namely sub-figure II of the composite power angle graph of the salient-pole synchronous motor, as shown in FIG. 7; motor mechanical model schematic graph, namely sub-figure III of the composite power angle graph of the salient-pole synchronous motor, as shown in FIG. 8; synchronous composite power angle graph, namely sub-figure IV of the composite power angle graph of the salient-pole synchronous motor, as shown in FIG. 9; motor-end composite magnetic leakage graph of the salient-pole synchronous motor, as shown in FIG. 20. In accordance with FIGS. 5, 6, 7, 8 and 9, the coordinates-model is established by using the data to be required, as shown in FIG. 10. In accordance with FIG. 20, the coordinates-model is established by using the data to be required, as shown in FIG. 21.

The letters of coordinate points of FIG. 5 are tabbed by 0 at the lower right corner, the letters of coordinate points of FIG. 6 are tabbed by 1 at the lower right corner, the letters of coordinate points of FIG. 7 are tabbed by 2 or 3 at the lower right corner, the letters of coordinate points of FIG. 8 are tabbed by 4 at the lower right corner, the letters of coordinate points of FIG. 9 are tabbed by 5 at the lower right corner, and the letters of coordinate points of FIG. 20 are tabbed by 20 at the lower right corner. The coordinates of the points are represented by the data to be required as follows:

Wherein, the power angle vector graph of the salient-pole synchronous motor as shown in FIG. 6 is within the electric machine theory; the vector vertex of the synchronous motor magnetic excitation potential $\dot{E}_0$, as shown in FIG. 6, has the same planar coordinates as points $A_0(a, b)$, $A_1(a, b)$ and $A_4(a, b)$; the vector vertex of the synchronous motor end voltage $\dot{U}$, as shown in FIG. 6, has the same planar coordinates as points $C_0(e, 0)$, $C_1(e, 0)$ and $C_4(e, 0)$; the vector vertex O of the synchronous motor power angle, as shown in FIG. 6, has the same planar coordinates as points $D_0(0, 0)$, $D_1(0, 0)$, $D_2(0, 0)$ and $D_4(0, 0)$; the coordinates value of point $A_2(a/2, b/2)$ is half of the planar coordinates value of the vector vertex of the synchronous motor magnetic excitation potential $\dot{E}_0$ as shown in FIG. 6; the coordinates value of point $C_2(e/2, 0)$ is half of the planar coordinates value of the vector vertex of the synchronous motor end voltage $\dot{U}$ as shown in FIG. 6; the distance between point $A_5$ and point $D_5$ represents the synchronous end voltage of the synchronous motor, the distance between point $C_5$ and point $D_5$ represents the synchronous system voltage, and the angle δ as shown in FIG. 9 is the phase angle difference between the synchronous motor voltage and the system voltage of synchronous time.

(2) The Gist of Imaging a) The coordinate points in each figure only integrate with the present figure and only image in the present figure, the image moves smoothly, and when the synchronous motor stator current is not zero, the image of FIG. 5 replaces the image of FIG. 9.

b) The axial center of the rigid body of the synchronous motor rotor: depicting circles by taking points $D_0$, $D_2$, $D_4$ and $D_5$ respectively as the center of the circle and taking 1/20 of the length of the segment $C_0D_0$ obtained when the synchronous motor is under rating operation as the radius (the circles are in white).

c) The rigid body of the synchronous motor rotor: depicting circles by taking points $D_0$, $D_2$, $D_4$ and $D_5$ respectively as the center of the circle and taking 1/4 of the length of the segment $C_0D_0$ obtained when the synchronous motor is under rating operation as the radius. The intersection portions of the rotor rigid body circles with the rotor rigid body axial center circles are still in white, and the rest portions are in dark blue.

d) The lever of the synchronous motor rotor: the lever is in dark blue (the same color as the rotor rigid body), and the line width of the lever is the same as the diameter of the axial center circle; when the rotor lever is a T-shaped lever, the length of the top beam of the T-shaped lever in each of FIGS. 5, 8 and 9 is two times as much as the length of the segment $D_0C_0$ obtained when the synchronous motor is under rating operation, and the top beam is central-positioned; the intersection portion of the lever with the rotor axial center is still in white. The length of the top beam of the T-shaped lever in FIG. 7 is two times as much as the length of the segment $D_2C_2$ obtained when the synchronous motor is under rating operation, and the top beam is central-positioned; the intersection portion of the lever with the rotor axial center is still in white. The 1/2 length of the top beam must not be shorter than the length of the segment $C_0E_0$, $C_2E_2$ or $C_4E_4$ in respective figure.

Points $D_0$ and $A_0$, points $A_3$ and $A_2$, points $D_4$ and $A_4$ and points $D_5$ and $A_5$ are connected by levers respectively.

e) The stator rigid body: depicting a circle by taking point $D_2$ as the center of the circle and taking the 1/3 length of the segment $C_0D_0$ obtained when the synchronous motor is under rating operation as the radius. The portion out of the intersection portion of this circle with the rotor rigid body circle, the rotor axial center circle and the rotor lever is in light grey.

Points $C_0$ and $D_0$, points $C_4$ and $D_4$, and points $C_5$ and $D_5$ are connected by thin real line respectively, and at both ends of the segments there are prolongations as long as 1/2 length of the segment $C_0D_0$ obtained when the synchronous motor is under rating operation; the intersection portions with the rotor rigid body circle and the rotor axial center circle are represented by dotted lines; the part under the thin real line is shadowed with parallel thin-short bias, while the rotor rigid body circle and the rotor axial center circle are not shadowed.

f) The stator lever: the stator lever is connected between points $C_2$ and $C_3$ with the same width as that of the rotor lever and the same color as that of the stator rigid body circle, and its intersection portion with the rotor rigid body circle and the rotor axial center circle is still in the color of the rotor rigid body circle and the rotor axial center circle.

Points $C_0$ and $D_0$, points $C_4$ and $D_4$, and points $C_5$ and $D_5$ are connected by black bold lines representing levers, the width of the bold line is the radius of the axial center circle, and its intersection portion with the rotor axial center circle and the rotor rigid body circle is represented by thin dotted line.

g) The spring: the spring is in black with realistic imaging; it is visualized to extend and shrink according to the lengthening and shortening of the spring; there ought to be an obvious joint between the spring and the lever.

Points $B_0$ and $C_0$, points $E_0$ and $C_0$, points $B_2$ and $C_2$, points $E_2$ and $C_2$, points $B_3$ and $C_3$, points $E_3$ and $C_3$, points $B_4$ and $C_4$, and points $E_4$ and $C_4$ are connected with springs respectively.

h) The joint between the spring and the lever: the joint between the spring and the lever is represented by a white circle, the diameter of the circle is slightly shorter than the diameter of the lever, the circle is positioned at the axial centers of the lever and the spring, and its connection with the spring is obviously visualized. The distances from the center of the circle on top of the lever representing the joint to both sides of the lever equal to the distances from the center to the ends of the lever.

i) The segments: points $E_0$ and $F_0$, points $B_0$ and $G_0$, and points $C_0$ and $G_0$ are connected by thin black lines respectively.

j) The vectors: linking points $D_1$ and $A_1$ by a segment with an arrow pointing to $A_1$; linking points $E_1$ and $A_1$ by a segment with an arrow pointing to $A_1$; linking points $C_1$ and $E_1$ by a segment with an arrow pointing to $E_1$; linking points $D_1$ and $C_1$ by a segment with an arrow pointing to $C_1$. Segment $E_1A_1$ is under segment $D_1A_1$. Points $T_{20}$ and $X_{20}$ are linked by a black bold segment with an arrow pointing to $X_{20}$; points $T_{20}$ and $Y_{20}$ are linked by a black bold segment with an arrow pointing to $Y_{20}$; points $T_{20}$ and $Z_{20}$ are linked by a colorful bold segment with an arrow pointing to $Z_{20}$; points $X_{20}$ and $Z_{20}$ and points $Y_{20}$ and $Z_{20}$ are linked by black thin dotted segments respectively.

k) The marks of the coordinate points:

Point $A_0$ for "$E_0$", point $B_0$ for "$E_d$", point $C_0$ for "U", point $D_0$ for "O", point $E_0$ for "$E_q$", point $F_0$ for "M", and point $G_0$ for "N";

Point $A_1$ upper for "$\dot{E}_0$", lower for "$\dot{E}_d$", point $C_1$ for "$\dot{U}$", point $D_1$ for "O", and point $E_1$ for "$\dot{E}_q$";

Point $A_2$ for "$\Sigma\Phi_0$", point $B_2$ for "$\Sigma\Phi_d$", point $C_2$ for "$\Sigma\Sigma\Phi$", point $D_2$ for "O", and point $E_2$ for "$\Sigma\Phi_q$";

Point $A_4$ for "$\Sigma\Phi_0$", point $B_4$ for "$\Sigma\Phi_d$", point $C_4$ for "$\Sigma\Sigma\Phi$", point $D_4$ for "O", and point $E_4$ for "$\Sigma\Phi_q$";

Point $A_5$ for "$E_0$", point $C_5$ for "U", and point $D_5$ for "O"; and

Points $X_{20}$, $Y_{20}$ and $Z_{20}$ for "$\Sigma\Phi_{0\sigma}$", "$\Sigma\Phi_{a\sigma}$" and "$\Sigma\Phi_{D\sigma}$" respectively.

The marks move with the moving of the positions of the coordinate points, and the relative positions of the marks and corresponding coordinate points keep constant.

l) The power angle marks: the dotted line representing the power angle passes through the center of the rotor, superposing the axial center of the lever, and being not longer than ⅓ of the length of segment $C_0D_0$ obtained when the synchronous motor is under rating operation. It is marked as "δ" within the range of the power angle, the levers at both sides of the power angle are connected by an arc, the vertex of the arc varies as the positions of the levers vary, the radius of the arc is longer than the radius of the rotor rigid body circle, and the center of the arc superposes the stator axial center.

m) The magnetic excitation adjustment signal marks:

Two Methods:

(a) In accordance with the abrupt change algorithm, depending on the length percentage by which $\Delta E_0$ takes the present magnetic excitation potential, when $\Delta E_0$ is greater than a given value it reveals the abrupt change of the magnetic excitation potential; when $\Delta E_0$ is positive, the adjustment signals are arranged from the top of the magnetic excitation lever to the rotor axial center, and when $\Delta E_0$ is negative, the adjustment signals are arranged from the rotor axial center along the reverse direction of the magnetic excitation potential. On the displaying screen shown in FIG. 5, the adjustment signals and their colors are marked.

(b) In accordance with the adjustment algorithm and the calculation results of the computer, by the values of $E_{01}$, $E_{02}$ ... $E_{0n}$ the adjustments are represented with different colors and arranged depending on the length percentages they take; the increment-adjustment signals are closely arranged from the top of the magnetic excitation lever to the rotor axial center in sequence, and the reduction-adjustment signals are linearly and closely arranged from the rotor axial center along the reverse direction of the magnetic excitation potential in sequence, as shown in FIG. 5. On the displaying screen shown in FIG. 5, the adjustment signals and their colors are marked.

n) The PQ curve mark: as shown in FIG. 10, determining the curve between points $M_0$ and $N_0$ according to the end heat-emitting limit of the synchronous motor and the greatest operation power angle of the synchronous motor that the system permits, determining the $N_0O_0$ curve according to the greatest active power that the synchronous motor permits, determining the $O_0P_0$ curve according to the greatest stator magnetic flux, the greatest stator current and the greatest stator potential that the synchronous motor permits, and determining the $P_0Q_0$ curve according to the greatest rotor magnetic flux, the greatest rotor current and the greatest rotor voltage that the synchronous motor permits. Points $M_0$ and $Q_0$ are both on the line $D_0G_0$, and points $G_0$ and $Q_0$ are connected by a thin line. Curve $M_0N_0O_0P_0Q_0$ (exclusive of the linear segment $M_0Q_0$) is depicted by a bold real line, the color of which is determined according to the user's requirement.

o) The composite magnetic leakage alarm circle: depicting a circle by taking $T_{20}$ as the center of the circle and taking the greatest magnetic leakage flux that the synchronous motor permits as the radius; this circle is the alarm circle, which is represented by a colorful bold curve.

p) The synchronous image requirements: depicting dotted circles by taking point $D_5$ as the center of the circle and taking segments $D_5A_5$ and $D_5C_5$ as the radius respectively. When $d\delta_x/dt$ is so big that the position of the lever $D_5A_5$ cannot be distinguished, the lever scanning portion outside the motor rotor rigid body is covered by misty light blue; when $d\delta_x/dt$ is so small that the position of the lever $D_5A_5$ can be distinguished, it can be represented by the graph shown in FIG. 9.

Q) The mechanical model as shown in FIG. 7 may rotate anticlockwise dynamically, the ratio of the rotation speed of the model and that of the real object is marked on the screen, and the rotation speed ratio may be selected.

R) The image alarm display: when an alarm is given on electric parameters or magnetic flux, the marks turn to red flickers, the speaker of the computer whistles, and the corresponding segments in the composite power angle graph and its sub-figures turn to red flickers; and when the alarm is relieved, the alarm marks or segments stay red but without flicker. When alarms are given on various parameters, the corresponding alarm segments shown in FIG. 10 can be referred to Table 2, and the images corresponding to the composite power angle graph or its sub-figures give alarms with red flickers; and when the alarms are relieved, the alarm images stay red but without flicker. When a parameter is clicked by the mouse, the corresponding segment shown in FIG. 10 turns to the alarm color (with reference to Table 2), and the images corresponding to the composite power angle graph and its sub-figures turn red. When an alarm is given on magnetic leakage, segment $T_{20}Z_{20}$ turns red, and mark $\Sigma\Phi_{D\sigma}$ turns red.

TABLE 2

Alarm table of the composite power angle graph of the salient-pole synchronous motor

Figure 11:
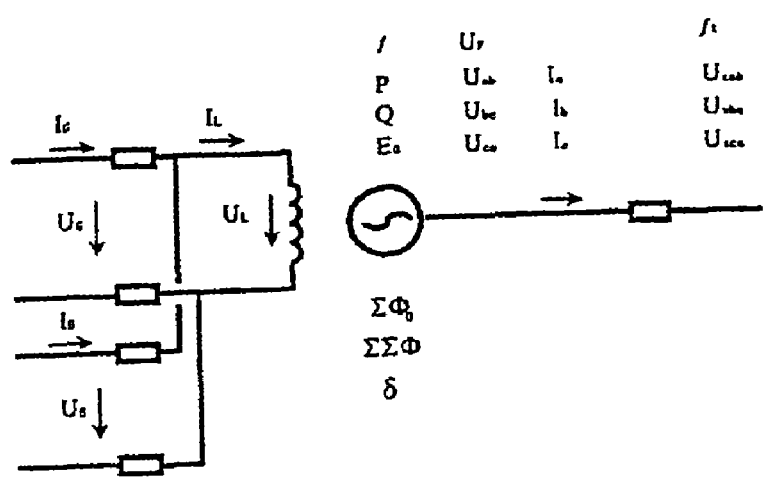
FIG. 11 is a diagram illustrating the digital symbols of the synchronous motor.

| Alarm parameter | Composite power angle graph | Composite power angle graph sub-figure I | Composite power angle graph sub-figure II | Composite power angle graph sub-figure III | Composite power angle graph sub-figure IV |
|---|---|---|---|---|---|
| Synchronous motor end voltage $U_{ab}$ $U_{bc}$ $U_{ca}$ | $D_0C_0$ | $D_1C_1$ | | | $D_5A_5$ (T-shaped lever) |
| Synchronous motor stator composite magnetic flux | $D_0C_0$ | | $C_2C_3$ | $D_4C_4$ | $D_5A_5$ (T-shaped lever) |
| Synchronous motor magnetic excitation voltage and current $u_L$ $i_L$ | $D_0A_0$ (T-shaped lever) | $D_1A_1$ | | | $D_5A_5$ (T-shaped lever) |
| Synchronous motor rotor magnetic flux | $D_0A_0$ (T-shaped lever) | | $A_2A_3$ (I-shaped level) | $D_4A_4$ (T-shaped lever) | $D_5A_5$ (T-shaped lever) |
| System voltage $U_{xab}$ $U_{xbc}$ $U_{xca}$ | | | | | $D_5C_5$ |
| Synchronous motor stator current $I_a$ $I_b$ $I_c$ | $E_0C_0$ $C_0B_0$ | | | | |
| Synchronous motor active power P | $E_0F_0$ and $B_0G_0$ | | | | |
| Synchronous motor reactive power Q | $F_0C_0$ and $C_0G_0$ | | | | | s) The digital mark display image: depicting the primary graph of the motor as shown in FIG. 11, marking the displayed letters, displaying corresponding data of the displayed letters after the letters; the actual value and the per-unit value may be switched; when an alarm is given, the marks and numbers turn to red flickers, and the speaker of the computer whistles, and when the alarm is relieved, the marks and numbers stay red but without flicker. The conditions of displaying the marks and numbers are:

(a) After the parallel-network of the synchronous motor, namely when a motor exit breaker DL shuts on, the state signal $U_{DL}$ of the motor exit breaker DL is at high level, the motor exit breaker DL turns blue, and the digital display image does not display the letter-marks and numbers of the voltage ($U_{xab}$ $U_{xbc}$ $U_{xca}$) and frequency ($f_x$) at the system side, while displaying other marks and numbers.

(b) During the parallel-off or the parallel-network of the synchronous motor, namely when the motor exit breaker DL shuts off, the state signal $U_{DL}$ of the motor exit breaker DL is at low level, and the mark of the motor exit breaker DL turns white and displays all the marks and numbers.

(c) When an operating excitation switch or a backup excitation switch of the synchronous motor turns on, its state signal $U_{ZG}$ or $U_{ZB}$ is at high level, and the corresponding switch turns blue; when the magnetic excitation switch turns off, its state signal $U_{ZG}$ or $U_{ZB}$ is at low level, and the mark of the corresponding switch turns white.

(d) When the synchronous motor exit breaker DL shuts off, the digital display value of the synchronous motor rotor magnetic flux $\Sigma\Phi_0$ is made equal to the value of the total stator magnetic flux $\Sigma\Sigma\Phi$. When the synchronous motor exit breaker DL shuts on, the calculation value is displayed as the value of the synchronous motor rotor magnetic flux $\Sigma\Phi_0$.

In accordance with the afore-mentioned imaging requirements, the six graphs as shown in FIGS. 5, 6, 7, 8, 9 and 20 can be obtained through program process. These six graphs can be combined with each other according to the requirements of the user, and any one of the combined images can be further combined with the digital display image of FIG. 11. Adjustments may be made within a small range on the stator radius and rotor radius, the axial center radius of the stator and of the rotor, the diameter of the lever and the spring joint radius of the synchronous motor, which are given in FIGS. 5, 7, 8 and 9; the models shown in FIGS. 5, 7, 8 and 9 may be made as various three-dimensional mechanical models; and the color of the models may be adjusted according to the requirements of the user.

2) Gist of the Computing Program (1) Determination of the Parameters

Given parameters: the leakage reactance $X_\sigma$ of the motor stator (Potier reactance), quadrature-axis synchronous reactance $X_q$, synchronous motor voltage, current and frequency conversion coefficients $K_U$, $K_I$ and $K_\omega$, system voltage and frequency conversion coefficients $K_{XU}$ and $K_{X\omega}$, active and reactive power conversion coefficients $K_P$, $K_Q$ and $K_m$, the conversion coefficients $K_L$, $K_{GL}$ and $K_{BL}$ of the magnetic excitation voltage and the operating excitation voltage and backup excitation voltage of the synchronous motor, the conversion coefficients $K_f$, $K_{Gf}$ and $K_{Bf}$ of the magnetic excitation current and the operating excitation current and backup excitation current of the synchronous motor, negative sequence voltage conversion coefficient $K_F$, the synchronous conversion coefficients $K_T$ and $K_N$ of the synchronous motor end voltage, the synchronous conversion coefficients $K_{XT}$ and $K_{XN}$ of the system voltage, the conversion coefficient $K_{TJ}$ of the voltage of the magnetic excitation adjustment signal, and magnetic flux leakage coefficients $K_1$, $K_2$ and $K_3$. Allowable range of main parameters: main parameters comprise motor end voltage, stator current, magnetic excitation voltage, magnetic excitation current, active power, reactive power, stator magnetic flux, rotor magnetic flux, power angle, system voltage and so on. Rating parameters of the motor mainly comprise: motor end voltage, stator current, magnetic excitation voltage, magnetic excitation current, active power, reactive power, stator magnetic flux, rotor magnetic flux, system voltage and so on.

(2) Calculation of the Parameters a) $P_j=K_P P$, $\Sigma P=K_m P_j$ b) $Q_j=K_Q Q$, $\Sigma Q=K_m Q_j$ c) $I_{aj}=K_I I_a$, $I_{bj}=K_I I_b$, $I_{cj}=K_I I_c$ d) $U_{abj}=K_U U_{ab}$, $U_{bcj}=K_U U_{bc}$, $U_{caj}=K_U U_{ca}$ e) $I_f=K_j I_L$, $I_{Gf}=K_G I_G$, $I_{Bf}=K_B I_{BY}$ f) $F=K_\omega f$, $F_x=K_{x\omega} f_x$ g) $U_{Fj}=K_F U_F$ h) $U_{xabj}=K_{XU}U_{xab}$, $U_{xbcj}=K_{XU}U_{xbc}$, $U_{xcaj}=K_{XU}U_{xca}$ i) $u_{Lj}=K_L u_L$, $u_{Gj}=K_{GL} u_G$, $u_{Bj}=K_{BL} u_B$ (3) Determination of the Value of the Direct-axis Synchronous Reactance $X_d$ of the Salient-pole Synchronous Motor Two methods for determining the value of the direct-axis synchronous reactance $X_d$ of the salient-pole synchronous motor are:

a) Directly determining the value of the direct-axis synchronous reactance $X_d$ in accordance with the air gap potential $E_\delta$ obtained when the synchronous motor is under normal operation, and the value of $X_d$ being kept constant.

b) Determining the value of $X_d$ through the value of $E_\delta$ in accordance with the function relationship between the air gap potential $E_\delta$ of the synchronous motor and the direct-axis synchronous reactance $X_d$, and comprising the steps of:

(a) Recording the dynamotor zero load ($I_a=0$) curve and the zero power factor ($I_a=I_N$) curve as shown in FIG. 12, namely curve $U=f_0(I_f)$ and curve $U=f_N(I_f)$.

(b) Determining the function relationship between the air gap potential $E_\delta$ of the synchronous motor and the direct-axis synchronous reactance $X_d$.

In accordance with the curves $U=f_0(I_f)$ and $U=f_N(I_f)$, taking n magnetic excitation current values of $I_{f1}$, $I_{f2}$ ... $I_{fn}$, and determining on the curve $U=f_N(I_f)$ points $B_1$, $B_2$ ... $B_n$ corresponding to $I_{f1}$, $I_{f2}$ ... $I_{fn}$ based on the zero power factor curve. Constructing n congruent triangles through points B, $B_1$, $B_2$ ... $B_n$ respectively (wherein segment CD is vertical to the I-coordinate, and $CD=I_N*X_\sigma$), intersecting with the zero load characteristic curve of $U=f_0(I_f)$ at points C, $C_1$, $C_2$, ... $C_n$ respectively, connecting points O and $C_1$, and extending segment $OC_1$ to intersect with the line that passes through point $B_1$ and is parallel to the U-coordinate at point $A_1$; similarly, connecting points O and $C_2$, ... connecting points O and $C_n$, and extending segment $OC_2$ ... extending $OC_n$, and intersecting with the lines that pass through points $B_2$ ... $B_n$ respectively and are parallel to the U-coordinate at points $A_2$ ... $A_n$ respectively.

Therefore, the synchronous saturated reactance corresponding to $E_{\delta 1}$, $E_{\delta 2}$ ... $E_{\delta n}$ respectively are:

$$X_{d1} = \frac{A_1 B_1}{I_N}, X_{d2} = \frac{A_2 B_2}{I_N} \ldots X_{dn} = \frac{A_n B_n}{I_N}$$

Depicting the relationship graph of the air gap potential and the reactance in accordance with the relationship between $E_{\delta 1}$, $E_{\delta 2}$ ... $E_{\delta n}$ and respective corresponding synchronous saturated reactance $X_{d1}$, $Xd_2$ ... $X_{dn}$, as shown in FIG. 13. The function $X_d=f(E_\delta)$ can be determined by this curve.

(c) Computing $E_\delta$.

Let $\dot{W} = P_j + jQ_j = W\angle\varphi$; $\dot{U}_a = \frac{U_{abj}}{\sqrt{3}} = e$;

Then $\dot{I}_{aj} = I_{aj}\angle(-\varphi)$, $\dot{E}_\delta = e + j\dot{I}_{aj}*X_\sigma$; $E_\delta = |\dot{E}_\delta|$ (d) Substituting the value of $E_\delta$ into function $X_d=f(E_\delta)$ to obtain the value of $X_d$.

(4) Calculations a) $\dot{H}=e+ji_{aj}*X_q=H\angle\delta$ $(90°>\delta>-90°)$ can be determined by this equation b) $I_d = I_{aj}\sin(\delta+\varphi)$ c) $I_q = I_{aj}\cos(\delta+\varphi)$ d) $a = (e*\cos\delta + I_d*X_d)*\cos\delta$ e) $b = (e*\cos\delta + I_d*X_d)*\sin\delta$ f) $c = e + I_d*X_d*\cos\delta$ g) $d = I_d*X_d*\sin\delta$ h) $f = e*\cos^2\delta$ i) $g = \frac{1}{2}e*\sin 2\delta$ j) Calculations of components of the magnetic excitation Two calculation methods are:

(a) Abrupt Change Algorithm

Assuming the average magnetic excitation potential of the synchronous motor during the period of $\Delta T$ from some certain time till now as $\Sigma E_0$, and the current magnetic excitation potential being $E_0$; assuming $\Delta E_{0=E0}-\Sigma E_0$. The value of $\Delta T$ and the times of sampling the magnetic excitation potential may be set.

(b) Adjustment Algorithm

Assuming the total automatic magnetic excitation adjustment of the integrated amplifier as $\Sigma$ U; the components respectively are:

$\Delta U = K_{TJ}U_1$, $U' = K_{TJ}U_2$, $\Delta f = K_{TJ}U_3$ ... $X = K_{TJ}U_n$;

$\sum U = K_{TJ}(U_1 + U_2 + \ldots + U_n)$, $f_1 = \frac{K_{TJ}U_1}{\sum U}, f_2 = \frac{K_{TJ}U_2}{\sum U} \ldots f_n = \frac{K_{TJ}U_n}{\sum U}$ Calculating $E_{01}=f_1\sqrt{a^2+b^2}$, $E_{02}=f_2\sqrt{a^2+b^2}$ ... $E_{0n}=f_n\sqrt{a^2+b^2}$ k) Calculation of coordinates of the magnetic flux leakage $X_1=K_1 a$; $Y_1=K_1 b$; $X_2=K_2(f-a)+K_3(c-a)$; $Y_2=K_2(g-b)+K_3(d-b)$; $X_3=X_1+X_2$; $Y_3=Y_1+Y_2$ l) Calculation of the per-unit value of the magnetic flux: assuming when the frequency is at the rating value, the per-unit value of a certain magnetic flux of the synchronous motor equals to the per-unit value of the corresponding voltage; determining the per-unit values of the magnetic excitation flux and the stator total magnetic flux of the motor according to the relationship among frequency, voltage and magnetic flux, and displaying the per-unit values with digitals; comparing the calculated values with the given values, and alarming when the calculated values are larger than the given values.

m) Calculations of the per-unit values of various parameters according to the requirements.

(5) During the synchronous parallel-network or parallel-off, namely when $I_a=I_b=I_c=0$, performing the following calculations on each set of the synchronous motor voltage and the system voltage inputted to the computer:

$$\dot{U} = K_T(u_{AB} + u_{BC}\angle 120° + u_{CA}\angle 240°) = U\angle \alpha \quad (a)$$

$$\dot{U}_x = K_{XT}(u_{XAB} + u_{XBC}\angle 120° + u_{XCA}\angle 240°) = U_x\angle \varepsilon \quad (b)$$

$$\frac{\dot{U}}{\dot{U}_x} = \frac{U}{U_x}\angle \delta_x \quad (c)$$

$$\bar{\delta}_x = \frac{\delta_1 + \delta_2 + \ldots \delta_n}{n} \quad (d)$$

(wherein $\delta_1, \delta_2 \ldots \delta_n$ are the values of the first, the second ... and the $n^{th}$ $\delta_x$ measured within a certain time period; when a second measured value enters, the value of the first $\delta_1$ is abandoned, and when the next measured value enters, the value of the second $\delta_2$ is abandoned; analogically, the new measured values replace the old ones; and the time period and the value of n can be set.)

(e) $h=K_N U_{abj}*\cos \bar{\delta}_x$ (f) $i=K_N U_{abj}*\sin \bar{\delta}_x$ (g) $j=K_{XN} U_{xabj}$ (6) Comparing various electric parameters with respective given values, and alarming when the electric parameters are out of the prescribed ranges.

II. The method for measuring the operating state of the non-salient-pole synchronous motor by using the non-salient-pole composite power angle meter comprises steps of:

1. Obtaining the stator voltage and current signals, magnetic excitation voltage and current signals, magnetic excitation adjustment signal and system voltage signal of the synchronous motor as well as the state signals of the exit switch of the synchronous motor and its magnetic excitation circuit switch through the external wires of the composite power angle meter.

2. Converting the related electric signals into digital signals through the A/D conversion chip of the data collection part of the composite power angle meter, inputting the chip-converted digital signals and the received digital signals to the host computer through COM or LPT, and performing program process on the inputted signals by the computer.

3. Inputting the related parameters or commands to the host computer by keyboard and mouse.

4. Performing the program process on the above data by the host computer.

The program process comprises two parts of displaying program and computing program, the gist of which are listed below:

1) The Gist of the Displaying Program (1) Establishing Image Coordinates

The composite power angle meter of the non-salient-pole synchronous motor can display six kinds of graphs, which respectively are: composite power angle graph of non-salient-pole synchronous motor, as shown in FIG. 14; electric power angle vector graph, namely sub-figure I of the composite power angle graph of the non-salient-pole synchronous motor, as shown in FIG. 15; motor mechanical model graph, namely sub-figure II of the composite power angle graph of the non-salient-pole synchronous motor, as shown in FIG. 16; motor mechanical model schematic graph, namely sub-figure III of the composite power angle graph of the non-salient-pole synchronous motor, as shown in FIG. 17; synchronous composite power angle graph, namely sub-figure IV of the composite power angle graph of the non-salient-pole synchronous motor, as shown in FIG. 18; motor-end composite magnetic leakage graph of the non-salient-pole synchronous motor, as shown in FIG. 22. In accordance with the common characteristics of these figures, the coordinates-model is established by using the data to be required, as shown in FIG. 19. In accordance with the characteristic of FIG. 22, the coordinates-model is established by using the data to be required, as shown in FIG. 23. The letters of coordinate points of FIG. 14 are tabbed by 10 at the lower right corner, the letters of coordinate points of FIG. 15 are tabbed by 11 at the lower right corner, the letters of coordinate points of FIG. 16 are tabbed by 12 or 13 at the lower right corner, the letters of coordinate points of FIG. 17 are tabbed by 14 at the lower right corner, the letters of coordinate points of FIG. 18 are tabbed by 15 at the lower right corner, and the letters of coordinate points of FIG. 22 are tabbed by 22 at the lower right corner. The coordinates of the points are represented by the data to be required as follows:

Wherein, the power angle vector graph of the non-salient-pole synchronous motor as shown in FIG. 15 is within the electric machine theory; the vector vertex of the synchronous motor magnetic excitation potential $\dot{E}_0$, as shown in FIG. 15, has the same planar coordinates as points $A_{10}(a, b)$, $A_{11}(a, b)$ and $A_{14}(a, b)$; the vector vertex of the synchronous motor end voltage $\dot{U}$, as shown in FIG. 15, has the same planar coordinates as points $C_{10}(e, 0)$, $C_{11}(e, 0)$ and $C_{14}(e, 0)$; the vector vertex O of the synchronous motor power angle, as shown in FIG. 15, has the same planar coordinates as points $D_{10}(0, 0)$, $D_{11}(0, 0)$, $D_{12}(0, 0)$ and $D_{14}(0, 0)$; the coordinates value of point $A_{12}(a/2, b/2)$ is half of the planar coordinates value of the vector vertex of the synchronous motor magnetic excitation potential as shown in FIG. 15; the coordinates value of point $C_{12}(e/2, 0)$ is half of the planar coordinates value of the vector vertex of the synchronous motor end voltage $\dot{U}$ as shown in FIG. 15; the distance between point $A_{15}$ and point $D_{15}$ represents the synchronous end voltage of the synchronous motor, the distance between point $C_{15}$ and point $D_{15}$ represents the synchronous system voltage, and the angle δ as shown in FIG. 18 is the phase angle difference between the synchronous motor voltage and the system voltage of synchronous time.

(2) The Gist of Imaging a) The coordinate points in each figure only integrate with the present figure and only image in the present figure, the image moves smoothly, and when the synchronous motor stator current is not zero, the image of FIG. 14 replaces the image of FIG. 18.

b) The axial center of the rigid body of the synchronous motor rotor: depicting circles by taking points $D_{10}$, $D_{12}$, $D_{14}$ and $D_{15}$ respectively as the center of the circle and taking 1/20 of the length of the segment $C_{10}D_{10}$ obtained when the synchronous motor is under rating operation as the radius (the circles are in white).

c) The rigid body of the synchronous motor rotor: depicting circles by taking points $D_{10}$, $D_{12}$, $D_{14}$ and $D_{15}$ respectively as the center of the circle and taking ⅕ of the length of the segment $C_{10}D_{10}$ obtained when the synchronous motor is under rating operation as the radius. The intersection portions of the rotor rigid body circles with the rotor rigid body axial center circles are still in white, and the rest portions are in dark blue.

d) The lever of the synchronous motor rotor: the lever is in dark blue (the same color as the rotor rigid body), and the line width of the lever is the same as the diameter of the axial center circle; the intersection portion of the lever with the rotor axial center is still in white.

Points $D_{10}$ and $A_{10}$, points $A_{12}$ and $A_{13}$, points $A_{14}$ and $D_{14}$ and points $A_{15}$ and $D_{15}$ are connected by levers respectively.

e) The stator rigid body: depicting a circle by taking point $D_{12}$ as the center of the circle and taking the ⅓ length of the segment $C_{10}D_{10}$ obtained when the synchronous motor is under rating operation as the radius. The portion out of the intersection portion of this circle with the rotor rigid body circle, the rotor axial center circle and the rotor lever is in light grey.

Points $C_{10}$ and $D_{10}$, points $C_{14}$ and $D_{14}$, and points $C_{15}$ and $D_{15}$ are connected by thin real line respectively, and at both ends of the segments there are prolongations as long as ½ length of the segment $C_{10}D_{10}$ obtained when the synchronous motor is under rating operation; the intersection portions with the rotor rigid body circle and the rotor axial center circle are represented by dotted lines; the part under the thin real line is shadowed with parallel thin-short bias, while the rotor rigid body circle and the rotor axial center circle are not shadowed.

f) The stator lever: the stator lever is connected between points $C_{12}$ and $C_{13}$ with the same width as that of the rotor lever and the same color as that of the stator rigid body, and its intersection portion with the rotor rigid body circle and the rotor axial center circle is still in the color of the rotor rigid body circle and the rotor axial center circle.

Points $C_{10}$ and $D_{10}$, points $C_{14}$ and $D_{14}$, and points $C_{15}$ and $D_{15}$ are connected by black bold lines representing levers, the width of the bold line is the radius of the axial center circle, and its intersection portion with the rotor axial center circle and the rotor rigid body circle is represented by thin dotted line.

g) The spring: the spring is in black with realistic imaging; it is visualized to extend and shrink according to the lengthening and shortening of the spring; there ought to be an obvious joint between the spring and the lever.

Points $A_{10}$ and $C_{10}$, points $A_{12}$ and $C_{12}$, points $A_{13}$ and $C_{13}$, and points $A_{14}$ and $C_{14}$ are connected with springs respectively.

h) The joint between the spring and the lever: the joint between the spring and the lever is represented by a white circle, the diameter of the circle is slightly shorter than the diameter of the lever, the circle is positioned at the axial centers of the lever and the spring, and its connection with the spring is obviously visualized. The distances from the center of the circle on top of the lever representing the joint to both sides of the lever equal to the distances from the center to the ends of the lever respectively.

i) The segments: points $A_{10}$ and $G_{10}$ and points $C_{10}$ and $G_{10}$ are connected by thin black lines respectively.

j) The vectors: linking points $D_{11}$ and $A_{11}$ by a segment with an arrow pointing to $A_{11}$; linking points $D_{11}$ and $C_{11}$ by a segment with an arrow pointing to $C_{11}$; linking points $C_{11}$ and $A_{11}$ by a segment with an arrow pointing to $C_{11}$. Points $T_{22}$ and $X_{22}$ are linked by a black bold segment with an arrow pointing to $X_{22}$; points $T_{22}$ and $Y_{22}$ are linked by a black bold segment with an arrow pointing to $Y_{22}$; points $T_{22}$ and $Z_{22}$ are linked by a colorful bold segment with an arrow pointing to $Z_{22}$; points $X_{22}$ and $Z_{22}$ and points $Y_{22}$ and $Z_{22}$ are linked by black thin dotted segments respectively.

k) The marks of the coordinate points:

$A_{10}$ for "$E_0$", point $C_{10}$ for "U", point $D_{10}$ for "O", and point $G_{10}$ for "M";

Point $A_{11}$ for "$\dot{E}_0$", point $C_{11}$ for "$\dot{U}$", and point $D_{11}$ for "O";

segment $A_{11}C_{11}$ for "$\dot{E}_0$";

Point $A_{12}$ for "$\Sigma\Phi_0$", point $C_{12}$ for "$\Sigma\Sigma\Phi$", and point $D_{12}$ for "O";

Point $A_{14}$ for "$\Sigma\Phi_0$", point $C_{14}$ for "$\Sigma\Sigma\Phi$", and point $D_{14}$ for "O";

Point $A_{15}$ for "$E_0$", point $C_{15}$ for "U", and point $D_{15}$ for "O";

The marks of the magnetic leakage composite graph: points $X_{22}$, $Y_{22}$ and $Z_{22}$ for "$\Sigma\Phi_{0\sigma}$", "$\Sigma\Phi_{a\sigma}$" and "$\Sigma\Phi_{D\sigma}$" respectively.

The marks move with the moving of the positions of the coordinate points, and the relative positions of the marks and corresponding coordinate points keep constant.

l) The power angle marks: the dotted line representing the power angle passes through the center of the rotor, superposing the axial center of the lever, and being not longer than ⅓ of the length of segment $C_{10}D_{10}$ obtained when the synchronous motor is under rating operation. It is marked as "δ" within the range of the power angle, the levers at both sides of the power angle are connected by an arc, the vertex of the arc varies as the positions of the levers vary, the radius of the arc is longer than the radius of the rotor rigid body circle, and the center of the arc superposes the stator axial center.

m) The Magnetic Excitation Adjustment Signal Marks:

Two Methods:

(a) In accordance with the abrupt change algorithm, depending on the length percentage by which $\Delta E_0$ takes the present magnetic excitation potential, when $\Delta E_0$ is greater than a given value it reveals the abrupt change of the magnetic excitation potential; when $\Delta E_0$ is positive, the adjustment signals are arranged from the top of the magnetic excitation lever to the rotor axial center, and when $\Delta E_0$ is negative, the adjustment signals are arranged from the rotor axial center along the reverse direction of the magnetic excitation potential. On the displaying screen shown in FIG. 14, the adjustment signals and their colors are marked.

(b) In accordance with the adjustment algorithm and the calculation results of the computer, by the values of $E_{01}$, $E_{02}$ . . . $E_{0n}$, the adjustments are represented with different colors and arranged depending on the length percentages they take; the increment-adjustment signals are closely arranged from the top of the magnetic excitation lever to the rotor axial center in sequence, and the reduction-adjustment signals are linearly and closely arranged from the rotor axial center along the reverse direction of the magnetic excitation potential in sequence, as shown in FIG. 14. On the displaying screen shown in FIG. 14, the adjustment signals and their colors are marked.

n) The PQ curve mark: determining the curve between points $M_{10}$ and $N_{10}$ according to the end heat-emitting limit of the synchronous motor and the greatest operation power angle of the synchronous motor that the system permits, determining the $N_{10}O_{10}$ curve according to the greatest active power that the synchronous motor permits, determining the $O_{10}P_{10}$ curve according to the greatest stator magnetic flux, the greatest stator current and the greatest stator potential that the synchronous motor permits, and determining the $P_{10}Q_{10}$ curve according to the greatest rotor magnetic flux, the greatest rotor current and the greatest rotor voltage that the synchronous motor permits. Points $M_{10}$ and $Q_{10}$ are both on the line $D_{10}G_{10}$ and points $G_{10}$ and $Q_{10}$ are connected by a thin line. Curve $M_{10}N_{10}O_{10}P_{10}Q_{10}$ (exclusive of the linear segment $M_{10}Q_{10}$) is depicted by a bold real line, the color of which is determined according to the user's requirement.

o) The composite magnetic leakage alarm circle: depicting a circle by taking $T_{22}$ as the center of the circle and taking the greatest magnetic leakage flux that the synchronous motor permits as the radius; this circle is the alarm circle, which is represented by a colorful bold curve.

its sub-figures turn to red flickers; and when the alarm is relieved, the alarm marks or segments stay red but without flicker. When alarms are given on various parameters, the corresponding alarm segments shown in FIG. 19 can be referred to Table 3, and the images corresponding to the composite power angle graph or its sub-figures give alarms with red flickers; and when the alarms are relieved, the alarm images stay red but without flicker. When a parameter is clicked by the mouse, the corresponding segment shown in FIG. 19 turns to the alarm color (with reference to Table 3), and the images corresponding to the composite power angle graph and its sub-figures turn red. When an alarm is given on magnetic leakage, segment $T_{22}Z_{22}$ turns red, and mark $\Sigma\Phi_{D\sigma}$ turns red.

TABLE 3

Alarm table of the composite power angle graph of the non-salient-pole synchronous motor

| Alarm parameter | Composite power angle graph | Composite power angle graph sub-figure I | Composite power angle graph sub-figure II | Composite power angle graph sub-figure III | Composite power angle graph sub-figure IV |
|---|---|---|---|---|---|
| Synchronous motor end voltage $U_{ab}$ $U_{bc}$ $U_{ca}$ | $D_{10}C_{10}$ | $D_{11}C_{11}$ | | | $D_{15}A_{15}$ |
| Synchronous motor stator composite magnetic flux | $D_{10}C_{10}$ | | $C_{12}C_{13}$ | $D_{14}A_{15}$ | $D_{15}A_{15}$ |
| Synchronous motor magnetic excitation voltage and current $u_L$ $i_L$ | $D_{10}A_{10}$ | $D_{11}C_{11}$ | | | $D_{15}A_{15}$ |
| Synchronous motor rotor magnetic flux | $D_{10}A_{10}$ | | $A_{12}A_{13}$ | $D_{14}A_{14}$ | $D_{15}A_{15}$ |
| System voltage $U_{xab}$ $U_{xbc}$ $U_{xca}$ | | | | | $D_{15}C_{15}$ |
| Synchronous motor stator current $I_a$ $I_b$ $I_c$ | $C_{10}A_{10}$ | | | | |
| Synchronous motor active power P | $A_{10}G_{10}$ | | | | |
| Synchronous motor reactive power Q | $C_{10}G_{10}$ | | | | | p) The synchronous image requirements: depicting dotted circles by taking point $D_{15}$ as the center of the circle and taking segments $D_{15}A_{15}$ and $D_{15}C_{15}$ as the radius respectively. When $d\delta_x/dt$ is so big that the position of the lever $D_{15}A_{15}$ cannot be distinguished, the lever scanning portion outside the motor rotor rigid body is covered by misty light blue; when $d\delta_x/dt$ is so small that the position of the lever $D_{15}A_{15}$ can be distinguished, it can be represented by the graph shown in FIG. 18.

q) The mechanical model as shown in FIG. 16 may rotate anticlockwise dynamically, the ratio of the rotation speed of the model and that of the real object is marked on the screen, and the rotation speed ratio may be selected.

r) The image alarm display: when an alarm is given on electric parameters or magnetic flux, the marks turn to red flickers, the speaker of the computer whistles, and the corresponding segments in the composite power angle graph and s) The digital mark display image: depicting the primary graph of the motor as shown in FIG. 11, marking the displayed letters, displaying corresponding data of the displayed letters after the letters; the actual value and the per-unit value may be switched; when an alarm is given, the marks and numbers turn to red flickers, and the speaker of the computer whistles, and when the alarm is relieved, the marks and numbers stay red but without flicker. The conditions of displaying the marks and numbers are:

(a) After the parallel-network of the synchronous motor, namely when a motor exit breaker DL shuts on, the state signal $U_{DL}$ of the motor exit breaker DL is at high level, the motor exit breaker DL turns blue, and the digital display image does not display the letter-marks and numbers of the voltage ($U_{xab}$ $U_{xbc}$ $U_{xca}$) and frequency ($f_x$) at the system side, while displaying other marks and numbers.

(b) During the parallel-off or the parallel-network of the synchronous motor, namely when the motor exit breaker DL shuts off, the state signal $U_{DL}$ of the motor exit breaker DL is at low level, and the mark of the motor exit breaker DL turns white and displays all the marks and numbers.

(c) When an operating excitation switch or a backup excitation switch of the synchronous motor turns on, its state signal $U_{ZG}$ or $U_{ZB}$ is at high level, and the corresponding switch turns blue; when the magnetic excitation switch turns off, its state signal $U_{ZG}$ or $U_{ZB}$ is at low level, and the mark of the corresponding switch turns white.

(d) When the synchronous motor exit breaker DL shuts off, the digital display value of the synchronous motor rotor magnetic flux $\Sigma\Phi_0$ is made equal to the value of the total stator magnetic flux $\Sigma\Sigma\Phi$. When the synchronous motor exit breaker DL shuts on, the calculation value is displayed as the value of the synchronous motor rotor magnetic flux $\Sigma\Phi_0$.

In accordance with the afore-mentioned imaging requirements, the six graphs as shown in FIGS. 14, 15, 16, 17, 18 and 22 can be obtained through program process. These six graphs can be combined with each other according to the requirements of the user, and any one of the combined images can be further combined with the digital display image of FIG. 11. Adjustments may be made within a small range on the stator radius and rotor radius, the axial center radius of the stator and of the rotor, the diameter of the lever and the spring joint radius of the synchronous motor, which are given in FIGS. 14, 16, 17 and 18; the models shown in FIGS. 14, 16, 17 and 18 may be made as various three-dimensional mechanical models; and the color of the models may be adjusted according to the requirements of the user.

2) Gist of the Computing Program (1) Determination of the Parameters

Given parameters: the leakage reactance $X_\sigma$ of the motor stator, synchronous motor voltage, current and frequency conversion coefficients $K_U$, $K_I$ and $K_\omega$, system voltage and frequency conversion coefficients $K_{XU}$ and $K_{X\omega}$, active and reactive power conversion coefficients $K_P$, $K_Q$ and $K_m$, the conversion coefficients $K_L$, $K_{GL}$ and $K_{BL}$ of the magnetic excitation voltage and the operating excitation voltage and backup excitation voltage of the synchronous motor, the conversion coefficients $K_f$, $K_{Gf}$ and $K_{Bf}$ of the magnetic excitation current and the operating excitation current and backup excitation current of the synchronous motor, the computing coefficient m of the synchronous motor, negative sequence voltage conversion coefficient $K_F$, the synchronous conversion coefficients $K_T$ and $K_N$ of the synchronous motor end voltage, the synchronous conversion coefficients $K_{XT}$ and $K_{XN}$ of the system voltage, the conversion coefficient $K_{TJ}$ of the voltage of the magnetic excitation adjustment signal, and magnetic flux leakage coefficients $K_1$ and $K_2$. Allowable range of main parameters: main parameters comprise motor end voltage, stator current, magnetic excitation voltage, magnetic excitation current, active power, reactive power, stator magnetic flux, rotor magnetic flux, power angle and system voltage. Rating parameters of the motor mainly comprise: motor end voltage, stator current, magnetic excitation voltage, magnetic excitation current, active power, reactive power, stator magnetic flux, rotor magnetic flux and system voltage.

(2) Calculation of the Parameters a) $P_j=K_P P$, $\Sigma P=K_m P_j$ b) $Q_j=K_Q Q$, $\Sigma Q=K_m Q_j$ c) $I_{aj}=K_I I_a$, $I_{bj}=K_I I_b$, $I_{cj}=K_I I_c$ d) $U_{abj}=K_U U_{ab}$, $U_{bcj}=K_U U_{bc}$, $U_{caj}=K_U U_{ca}$ e) $I_{fj}=K_f I_L$, $I_{Gf}=K_{Gf} I_G$, $I_{Bf}=K_{Bf} I_{BY}$ f) $F=K_\omega f$, $F_x=K_{x\omega} f_x$ g) $U_{Fj}=K_F U_F$ h) $U_{xabj}=K_{XU} U_{xab}$, $U_{xbcj}=K_{XU} U_{xbc}$, $U_{xcaj}=K_{XU} U_{xca}$ i) $u_{Lj}=K_L u_L$, $u_{Gj}=K_{GL} u_G$, $u_{Bj}=K_{BL} u_B$ (3) Determination of the Value of the Direct-axis Synchronous Reactance $X_d$ of the Non-salient-pole Synchronous Motor Two methods for determining the value of the direct-axis synchronous reactance $X_d$ of the non-salient-pole synchronous motor are:

a) Directly determining the value of the direct-axis synchronous reactance $X_d$ in accordance with the air gap potential $E_\delta$ obtained when the synchronous motor is under normal operation, and the value of $X_d$ being kept constant.

b) Determining the value of $X_d$ in accordance with the function relationship between the air gap potential $E_\delta$ of the synchronous motor and the direct-axis synchronous reactance $X_d$, and comprising the steps of:

(a) Recording the dynamotor zero load ($I_a=0$) curve and the zero power factor ($I_a=I_n$) curve as shown in FIG. 12, namely curve $U=f_0(I_f)$ and curve $U=f_N(I_f)$.

(b) Determining the function relationship between the air gap potential $E_\delta$ of the synchronous motor and the direct-axis synchronous reactance $X_d$.

In accordance with the curves $U=f_0(I_f)$ and $U=f_N(I_f)$, taking n magnetic excitation current values of $I_{f1}$, $I_{f2}$ ... $I_{fn}$, and determining on the curve $U=f_N(I_f)$ points $B_1$, $B_2$ ... $B_n$ corresponding to $I_{f1}$, $I_{f2}$ ... $I_{fn}$ based on the zero power factor curve. Constructing n congruent triangles through points B, $B_1$, $B_2$ ... $B_n$ respectively (wherein segment CD is vertical to the I-coordinate, and $CD=I_N*X_\sigma$) intersecting with the zero load characteristic curve of $U=f_0(I_f)$ at points $C$, $C_1$, $C_2$, ... $C_n$ respectively, connecting points O and $C_1$, and extending segment $OC_1$ to intersect with the line that passes through point $B_1$ and is parallel to the U-coordinate at point $A_1$; similarly, connecting points O and $C_2$, ... connecting points O and $C_n$, and extending segment $OC_2$ ... extending $OC_n$, and intersecting with the lines that pass through points $B_2$ ... $B_n$ respectively and are parallel to the U-coordinate at points $A_2$ ... $A_n$ respectively.

Therefore, the synchronous saturated reactance corresponding to $E_{\delta 1}$, $E_{\delta 2}$ ... $E_{\delta n}$ respectively are:

$$X_{d1} = \frac{A_1 B_1}{I_N}, \; X_{d2} = \frac{A_2 B_2}{I_N} \; \ldots \; X_{dn} = \frac{A_n B_n}{I_N}.$$

Depicting the relationship graph of the air gap potential and the reactance in accordance with the relationship between $E_{\delta 1}$, $E_{\delta 2}$ ... $E_{\delta n}$ and respective corresponding synchronous saturated reactance $X_{d1}$, $X_{d2}$ ... $X_{dn}$, as shown in FIG. 13. The function $X_d=f(E_\delta)$ can be determined by this curve.

(c) Computing $E_\delta$.

$$\text{Let } \dot{W} = P_j + jQ_j = W\angle\varphi; \; \dot{U}_a = \frac{U_{abj}}{\sqrt{3}} = e;$$

$$\text{Then } \dot{I}_{aj} = I_{aj}\angle(-\varphi), \; \dot{E}_\delta = e + j\dot{I}_{aj}*X_\sigma; \; E_\delta = |\dot{E}_\delta|$$

(d) Substituting the value of $E_\delta$ into function $X_d=f(E_\delta)$ to obtain the value of $X_d$.

(4) Calculations $$a = e + \frac{Q_i}{me}X_d \quad \text{a)}$$

$$b = \frac{P_i}{me}X_d \quad \text{b)}$$

c) Calculations of Components of the Magnetic Excitation
Two calculation methods are:
(a) Abrupt Change Algorithm Assuming the average magnetic excitation potential of the synchronous motor during the period of $\Delta T$ from some certain time till now as $\Sigma E_0$, and the current magnetic excitation potential being $E_0$; assuming $\Delta E_0 = E_0 - \Sigma E_0$. The value of $\Delta T$ and the times of sampling the magnetic excitation potential may be set.

(b) Adjustment Algorithm

Assuming the total automatic magnetic excitation adjustment of the integrated amplifier as $\Sigma$ U; the components respectively are:

$$\Delta U = K_{TJ}U_1, \; U' = K_{TJ}U_2, \; \Delta f = K_{TJ}U_3 \ldots X = K_{TJ}U_n;$$

$$\sum U = K_{TJ}(U_1 + U_2 + \ldots + U_n),$$

$$f_1 = \frac{K_{TJ}U_1}{\sum U}, \; f_2 = \frac{K_{TJ}U_2}{\sum U} \ldots f_n = \frac{K_{TJ}U_n}{\sum U}$$

Calculating $E_{01} = f_1\sqrt{a^2+b^2}$, $E_{02} = f_2\sqrt{a^2+b^2} \ldots E_{0n} = f_n\sqrt{a^2+b^2}$ d) Calculation of the per-unit value of the magnetic flux: assuming when the frequency is at the rating value, the per-unit value of a certain magnetic flux of the synchronous motor equals to the per-unit value of the corresponding voltage; determining the per-unit values of the magnetic excitation flux and the stator total magnetic flux of the motor according to the relationship among frequency, voltage and magnetic flux; comparing the calculated values with the given values, and alarming when the calculated values are larger than the given values.

e) comparing various electric parameters with respective given values, and alarming when the electric parameters are larger than the given values.

f) Calculation of the coordinates of the magnetic flux leakage $X_1 = K_1 a$; $Y_1 = K_1 b$; $X_2 = K_2$ (e−a); $Y_2 = -K_2 b$; $X_3 = X_1 + X_2$; $Y_3 = Y_1 + Y_2$ (5) During the synchronous parallel-network or parallel-off, namely when $I_a = I_b = I_c = 0$, performing the following calculations on the synchronous motor voltage signal and the system voltage signal inputted to the computer:

$$\dot{U} = K_T(u_{AB} + u_{BC}\angle 120° + u_{CA}\angle 240°) = U\angle\alpha \quad \text{(a)}$$

$$\dot{U}_x = K_{XT}(u_{XAB} + u_{XBC}\angle 120° + u_{XCA}\angle 240°) = U_x\angle\varepsilon \quad \text{(b)}$$

$$\frac{\dot{U}}{\dot{U}_x} = \frac{U}{U_x}\angle\delta_x \quad \text{(c)}$$

$$\overline{\delta}_x = \frac{\delta_1 + \delta_2 + \ldots \delta_n}{n} \quad \text{(d)}$$

(wherein $\delta_1 \delta_2 \ldots \delta_n$ are the values of the first, the second . . . and the $n^{th}$ $\delta_x$ measured within a certain time period; when a second measured value enters, the value of the first $\delta_1$ is abandoned, and when the next measured value enters, the value of the second $\delta_2$ is abandoned; analogically, the new measured values replace the old ones; and the time period and the value of n can be set.)

(e) $h = K_N U_{abj} * \cos \overline{\delta}_x$
(f) $i = K_N U_{abj} * \sin \overline{\delta}_x$
(g) $j = K_{XN} U_{xabj}$ (6) Comparing various electric parameters with respective given values, and alarming when the electric parameters are out of the prescribed ranges.

Compared with the single electric power angle vector graph depicted by the conventional power angle meter for measuring the operating state of the motor, the electric model graph, mechanical model graph and motor-end composite magnetic leakage graph depicted by the composite power angle meter of the present invention for measuring the operating state of the synchronous motor have the following advantages:

Comparisons are made in terms of the salient-pole synchronous motor and the non-salient-pole synchronous motor, respectively.

1. The Comparison Between the Composite Power Angle Meter of the Salient-Pole Synchronous Motor and the Conventional Power Angle Meter a) The composite power angle meter of the salient-pole synchronous motor may display six graphs, and it displays not only the composite power angle of the salient-pole synchronous motor, but also the sub-figures of the composite power angle, with reference to FIG. 5 to FIG. 9; and it realizes the functions of image-alarming and sound-alarming. The PQ curve in the composite power angle graph of FIG. 5 defines the locus range of the vertex $E_0$ of the magnetic excitation lever, the composite magnetic leakage graph in FIG. 20 defines the composite magnetic leakage range of the stator and rotor that the end heat-emitting of the synchronous motor permits, thus providing intuitional limit graph of the motor parameters for operators; however, the conventional power angle meter only displays the electric vector graph, as shown in FIG. 6.

b) The composite power angle graph (FIG. 5) displayed by the composite power angle meter of the salient-pole synchronous motor has double significations: in one aspect, it represents the electric power angle vector graph of the salient-pole synchronous motor, and in another aspect, it represents the mechanical power angle graph showed with the magnetic flux. The power angle represented by the composite power angle graph of the salient-pole motor has both electric and mechanical characteristics. However, the conventional power angle graph only shows electric vectors and only reflects the electric characteristics of the power angle.

c) The graphs displayed by the composite power angle meter further comprise the mechanical model graph of the synchronous motor, in addition to the electric vector graph. The stator and rotor levers in the mechanical model as shown in FIG. 7 are the total composite magnetic flux $\Sigma\Sigma\Phi$ and magnetic excitation composite magnetic flux $\Sigma\Phi_0$ in the motor stator respectively, the elasticity coefficients of the quadrature-axis and direct-axis springs are $$\frac{4mk^2w^2}{9l_q} \text{ and } \frac{4mk^2w^2}{9l_d}$$

respectively (wherein m is the phase number of the motor stator, kW represents the effective turns of the stator coil, and $l_q$ and $l_d$ are the quadrature-axis and direct-axis synchronous inductance coefficients of the motor respectively), and the graph simulates the anticlockwise rotations of the motor stator and rotor. The mechanical models shown in FIG. 5 and FIG. 8 take the stator as a reference object, the stator lever and rotor lever are $\Sigma\Sigma\Phi$ and $\Sigma\Phi_0$ respectively, and the elasticity coefficients of the quadrature-axis and direct-axis springs are $$\frac{2mk^2w^2}{9l_q} \text{ and } \frac{2mk^2w^2}{9l_d}$$

respectively.

The mechanical power angle graph intuitively reveals the mutual effective relationship between the motor stator and the motor rotor from mechanical aspect, and operators may refer to the mechanical model to understand the principle of the operating of the motor and adjust motor parameters precisely.

d) Compared with the electric vector graph, the composite power angle graph further includes assistant lines, as shown in FIG. 5.

i. If the lengths of $OE_0$ and OU represent the magnetic excitation potential and the end voltage of the dynamotor respectively, $UE_q$ and $UE_d$ represent the quadrature-axis component and direct-axis component of the stator potential of the synchronous motor respectively, and $E_qM$ and MU represent the active component and reactive component of the stator quadrature-axis potential of the synchronous motor, point M on segment OU or superposing point U respectively represent that the inductive reactive power done by the quadrature-axis potential is negative or zero, point $E_q$ above, below or on the line OU respectively represent that the active power done by the quadrature-axis potential is positive, negative or zero; $E_dN$ and NU represent the active component and reactive component done by the stator direct-axis potential of the synchronous motor respectively, point N on the segment OU, on the extension of the segment OU or superposing point U respectively represent that the inductive reactive power done by the direct-axis potential is negative, positive or zero, and point $E_d$ above, below or on the line OU respectively represent that the active power done by direct-axis potential is positive, negative or zero.

ii. If the lengths of $OE_0$ and OU represent the magnetic excitation flux and the total composite magnetic flux in the stator coil of the dynamotor respectively, $UE_q$ and $UE_d$ respectively represent the quadrature-axis component and direct-axis component of the composite magnetic flux generated by the reaction of the stator armature of the synchronous motor.

iii. If the lengths of $OE_0$ and OU represent the rotor lever and stator lever of the synchronous motor respectively, $UE_q$ and $UE_d$ respectively represent the extended lengths of the springs by which the rotor lever of the synchronous motor pulls the stator lever along directions of quadrature-axis and direct-axis, and segments $E_qM$ and $E_dN$ respectively represent the active length components generated by the extensions of the quadrature-axis spring and direct-axis spring, anticlockwise and clockwise pulls generate positive active power and negative active power respectively, segments MU and UN respectively represent the reactive components generated by the extensions of the quadrature-axis spring and direct-axis spring, the pull along the direction from point O to point U generates positive inductive reactive power, and the pull along the direction from point U to point O generates the negative inductive reactive power. Generally, the sum of $E_qM\pm E_dN$ may be regarded as the active power, and the sum of $MU\pm UN$ may be regarded as the reactive power, wherein '+' is adopted when forces generated by the springs orient the same direction, and '−' is adopted when forces generated by the springs orient opposite to each other.

e) Compared with electric vector graph (FIG. 6), the composite power angle graph of the salient-pole synchronous motor (FIG. 5) additionally includes the graph of the magnetic excitation adjustment signal.

By adding the magnetic excitation adjustment display, the operators are assisted to check the operating state of the automatic magnetic excitation adjuster intuitionally, judge the influence of the adjustment signal on the stable operation of the electric power system, and adjust the magnetic excitation accurately and duly in case of accident.

f) The newly added synchronous image (FIG. 9) intuitionally shows the relative position of the rotor rigid body magnetic lever of the synchronous motor and the magnetic lever of the electric power system, which may assist the operators to adjust the rotation speed and end voltage of the motor accurately.

2. The Comparison Between the Composite Power Angle Meter of the Non-Salient-Pole Synchronous Motor and the Conventional Power Angle Meter a) The composite power angle meter of the non-salient-pole synchronous motor may display six graphs, and it displays not only the composite power angle of the non-salient-pole synchronous motor, but also the sub-figures of the composite power angle, with reference to FIG. 14 to FIG. 18; and it realizes the functions of image-alarming and sound-alarming. The PQ curve in the composite power angle graph of FIG. 14 defines the locus range of the vertex $E_0$ of the magnetic excitation lever, the composite magnetic leakage graph in FIG. 22 defines the composite magnetic leakage range of the stator and rotor that the end heat-emitting of the synchronous motor permits, thus providing intuitional limit graph of the motor parameters for operators; however, the conventional power angle meter only displays the electric vector graph, as shown in FIG. 15.

b) The composite power angle graph (FIG. 14) displayed by the composite power angle meter of the non-salient-pole synchronous motor has double significations: in one aspect, it represents the electric power angle vector graph of the non-salient-pole synchronous motor, and in another aspect, it represents the mechanical power angle graph showed with the magnetic flux. The power angle of the synchronous motor represented by the composite power angle graph of the non-salient-pole motor has both electric and mechanical characteristics. However, the conventional power angle graph (FIG. 15) only shows electric vectors and only reflects the electric characteristics of the power angle.

c) The graphs displayed by the composite power angle meter further comprise the mechanical model graph of the synchronous motor, in addition to the electric vector graph displayed by the conventional power angle meter. Thus, the mutual effective relationship between the motor stator and the motor rotor can be intuitionally revealed from mechanical aspect. The stator and rotor levers in the mechanical model as shown in FIG. 16 are the total composite magnetic flux $\Sigma\Sigma\Phi$ and magnetic excitation composite magnetic flux $\Sigma\Phi_0$ in the motor stator respectively, the elasticity coefficient of the spring is $$\frac{4mk^2w^2}{9l}$$

(wherein m is the phase number of the motor stator, kw represents the effective turns of the stator coil, and l is the synchronous inductance coefficient of the motor), and the graph simulates the anticlockwise rotations of the motor stator and rotor. The mechanical models shown in FIG. 14 and FIG. 17 take the stator as a reference object, the stator lever and rotor lever are $\Sigma\Sigma\Phi$ and $\Sigma\Phi_0$ respectively, and the elasticity coefficient of the spring is $$\frac{2mk^2w^2}{9l}.$$

The mechanical power angle graph intuitively reveals the mutual effective relationship between the motor stator and the motor rotor from mechanical aspect, and operators may refer to the mechanical model to understand the principle of the operating of the motor and adjust motor parameters precisely.

d) Compared with the electric vector graph, the composite power angle graph further includes assistant lines, as shown in FIG. 14.

i. The lengths of $OE_0$ and OU represent the magnetic excitation potential and the end voltage of the motor respectively, and $E_0U$, $E_0M$ and UM represent the stator potential of the motor, the active component and reactive component of the stator potential respectively; point M on the segment OU, on the extension of the segment OU or superposing point U represent that the motor generates capacitive reactive power, inductive reactive power or zero reactive power respectively. Point $E_0$ above, below or on line OU respectively represent that the motor is a dynamotor, is an electromotor, or has zero active power.

ii. The lengths of $OE_0$ and OU represent the magnetic excitation flux lever and the total magnetic flux lever in the stator coil of the motor respectively, and $E_0U$, $E_0M$ and UM represent the extended length of the mechanical lever spring of the dynamotor, the active component and reactive component of the extended length of the spring respectively; point M on the segment OU, on the extension of the segment OU or superposing point U represent that the motor generates capacitive reactive power, inductive reactive power or zero reactive power respectively. Point $E_0$ above or below the lever OU or on the line OU respectively represent that the spring has an anticlockwise torsion, has a clockwise torsion or has no torsion with respect to the stator, and that the motor operates in manner of a dynamotor, an electromotor or zero active power.

iii. If the length of $UE_0$ represents the value of the apparent power W of the motor, the lengths of $E_0M$ and UM represent the values of the active power and reactive power of the dynamotor respectively.

iv. If the length of $UE_0$ represents the value of the stator current I of the motor, the lengths of $E_0M$ and UM represent the values of the active component $I_p$ and reactive component $I_Q$ of the stator current of the motor respectively.

v. Compared with electric vector graph (FIG. 15), the composite power angle graph of the non-salient-pole synchronous motor (FIG. 14) additionally includes the graph of the magnetic excitation adjustment signal.

By adding the magnetic excitation adjustment display, the operators are assisted to check the operating state of the automatic magnetic excitation adjuster intuitionally, judge the influence of the adjustment signal on the stable operation of the electric power system, and adjust the magnetic excitation accurately and duly in case of accident.

vi. The newly added synchronous image (FIG. 18) intuitionally shows the relative position of the rotor rigid body magnetic lever of the synchronous motor and the magnetic lever of the electric power system, which may assist the operators to adjust the rotation speed and end voltage of the motor accurately.

INDUSTRIAL APPLICABILITY

The present invention may intuitionally reflect the operating state of the synchronous motor from both electric and mechanical aspects, and may reveal the end composite magnetic leakage situation of the synchronous motor. Compared with the electric vector graph, the composite power angle graph of the motor depicted by the present invention further includes the mechanical model graph of the synchronous motor, which is helpful for operators of various specialties to dialectically analyze the operating state of the synchronous motor from both electric and mechanical aspects; the end composite magnetic leakage graph of the synchronous motor depicted by the present invention is helpful for operators to analyze and monitor the end heat-emitting situation of the synchronous motor. The method provided by the present invention may, in the electric power system industry, be an effective tool for users to apply in the analysis of the magnetic excitation characteristics, the magnetic excitation adjustment, the synchronous parallel-network, the operation monitoring and controlling, and other tasks of the synchronous motor, so as to enable the synchronous motor to operate in an optimum state.

The invention claimed is:

1. A method for measuring the operating state of a synchronous motor by using a composite power angle meter, wherein the method comprises the steps of:
   a. using the composite power angle meter to obtain stator voltage and current signals, a magnetic excitation voltage and current signals, a magnetic excitation adjustment signal and a system voltage signal of the synchronous motor in real time;
   b. performing internal controlling programs to calculate parameters of the synchronous motor in real time;
   c. depicting various electric and mechanical model graphs as well as end composite magnetic leakage graph of the synchronous motor, and displaying the graphs on a display; and
   wherein the steps for depicting images of composite power angle graph of a non-salient-pole synchronous motor are:
   (1) establishing image coordinates of a composite power angle graph, an electric power angle vector graph, a motor mechanical model graph, a motor mechanical model schematic graph, a synchronous composite power angle graph and a motor end composite magnetic leakage graph of a non-salient-pole synchronous motor as follows:
   Composite power angle graph: $A_{10}(a, b)$, $C_{10}(e, 0)$, $D_{10}(0, 0)$, $G_{10}(a, 0)$;
   Electric power angle vector graph: $A_{11}(a, b)$, $C_{11}(e, 0)$, $D_{11}(0, 0)$;

Motor mechanical model graph: $A_{12}(a/2, b/2)$, $C_{12}(e/2, 0)$, $D_{12}(0, 0)$, $A_{13}(-a/2, -b/2)$, $C_{13}(-e/2, 0)$;

Motor mechanical model schematic graph: $A_{14}(a, b)$, $C_{14}(e, 0)$, $D_{14}(0, 0)$;

Synchronous composite power angle graph: $A_{15}(h, i)$, $C_{15}(j, 0)$, $D_{15}(0, 0)$;

Motor end composite magnetic leakage graph: $T_{22}(0, 0)$, $X_{22}(X_1, Y_1)$, $Y_{22}(X_2, Y_2)$, $Z_{22}(X_3, Y_3)$;

wherein the electric power angle vector graph is the power angle vector graph of the non-salient-pole synchronous motor within the electric machine theory; vector vertexes of magnetic excitation potential in the power angle vector graph of the non-salient-pole synchronous motor have the same planar coordinates as points $A_{10}, A_{11}$ and $A_{14}$; vector vertexes of the motor end voltage in the power angle vector graph of the non-salient-pole synchronous motor have the same planar coordinates as points $C_{10}, C_{11}$ and $C_{14}$; vector vertexes of the power angle in the power angle vector graph of the non-salient-pole synchronous motor have the same planar coordinates as points $D_{10}, D_{11}, D_{12}$ and $D_{14}$; coordinates value of point $A_{12}$ is half of the planar coordinates value of the vector vertex of the magnetic excitation potential in the power angle vector graph of the non-salient-pole synchronous motor; coordinates value of point $C_{12}$ is half of the planar coordinates value of the vector vertex of the motor end voltage in the power angle vector graph of the non-salient-pole synchronous motor; distance between point $A_{15}$ and point $D_{15}$ represents synchronous end voltage of the synchronous motor; distance between point $C_{15}$ and point $D_{15}$ represents synchronous system voltage;

(2) wherein in a gist of imaging:

a) the coordinate points in each figure only integrate with the present figure and only image in the present figure, the image moving smoothly;

b) with respect to an axial center of the rigid body of the synchronous motor rotor, depicting circles by taking points $D_{10}, D_{12}, D_{14}$ and $D_{15}$ respectively as the center of the circle and taking $1/20$ of the length of the segment $C_{10}D_{10}$ obtained when the synchronous motor is under rated operation as the radius; and the circles are in white;

c) with respect to the rigid body of the synchronous motor rotor, depicting circles by taking points $D_{10}, D_{12}, D_{14}$ and $D_{15}$ respectively as the center of the circle and taking $1/5$ of the length of the segment $C_{10}D_{10}$ obtained when the synchronous motor is under rated operation as the radius; the intersection portions of the rotor rigid body circles with the rotor rigid body axial center circles are still in white, and other portions are in dark blue;

d) wherein a lever of the synchronous motor rotor is in dark blue, the same color as the rotor rigid body, and the line width of the lever is the same as the diameter of the axial center circle; the intersection portion of the lever with the rotor axial center is still in white;

wherein points $D_{10}$ and $A_{10}$, points $A_{12}$ and $A_{13}$, points $A_{14}$ and $D_{14}$ and points $A_{15}$ and $D_{15}$ are connected by levers respectively;

e) with respect to the stator rigid body, depicting a circle by taking point $D_{12}$ as the center of the circle and taking the $1/3$ length of the segment $C_{10}D_{10}$ obtained when the synchronous motor is under rating operation as the radius; the portion out of the intersection portion of this circle with the rotor rigid body circle, the rotor axial center circle and the rotor lever is in light grey;

wherein points $C_{10}$ and $D_{10}$, points $C_{14}$ and $D_{14}$, and points $C_{15}$ and $D_{15}$ are connected by thin real line respectively, and at both ends of the segments there are prolongations as long as $1/2$ length of the segment $C_{10}D_{10}$ obtained when the synchronous motor is under rated operation; the intersection portions with the rotor rigid body circle and the rotor axial center circle are represented by dotted lines; the part under the thin real line is shadowed with parallel thin-short bias, while the rotor rigid body circle and the rotor axial center circle are not shadowed;

f) wherein the stator lever is connected between points $C_{12}$ and $C_{13}$ with the same width as that of the rotor lever and the same color as that of the stator rigid body, and its intersection portion with the rotor rigid body circle and the rotor axial center circle is still in the color of the rotor rigid body circle and the rotor axial center circle;

wherein points $C_{10}$ and $D_{10}$, points $C_{14}$ and $D_{14}$, and points $C_{15}$ and $D_{15}$ are connected by black bold lines representing levers, the width of the bold line is the radius of the axial center circle, and its intersection portion with the rotor axial center circle and the rotor rigid body circle is represented by thin dotted line;

g) wherein a spring is in black; the spring being visualized to extend and shrink according to the lengthening and shortening of the spring; and wherein there is an obvious joint between the spring and the lever;

wherein points $A_{10}$ and $C_{10}$, points $A_{12}$ and $C_{12}$, points $A_{13}$ and $C_{13}$, and points $A_{14}$ and $C_{14}$ are connected with springs respectively;

h) wherein a joint between the spring and the lever is represented by a white circle, the diameter of the circle is slightly shorter than the diameter of the lever, the circle is positioned at the axial centers of the lever and the spring, and its connection with the spring is obviously visualized; the distances from the center of the circle on top of the lever representing the joint to both sides of the lever equal to the distances from the center to the ends of the lever respectively;

i) wherein in segments, points $A_{10}$ and $G_{10}$ and points $C_{10}$ and $G_{10}$ are connected by thin black lines respectively;

j) wherein vectors are depicted by linking points $D_{11}$ and $A_{11}$ by a segment with an arrow pointing to $A_{11}$; linking points $D_{11}$ and $C_{11}$ by a segment with an arrow pointing to $C_{11}$; linking points $C_{11}$ and $A_{11}$ by a segment with an arrow pointing to $C_{11}$; points $T_{22}$ and $X_{22}$ are linked by a black bold segment with an arrow pointing to $X_{22}$; points $T_{22}$ and $Y_{22}$ are linked by a black bold segment with an arrow pointing to $Y_{22}$; points $T_{22}$ and $Z_{22}$ are linked by a colorful bold segment with an arrow pointing to $Z_{22}$; points $X_{22}$ and $Z_{22}$ and points $Y_{22}$ and $Z_{22}$ are linked by black thin dotted segments respectively;

k) wherein the marks of the coordinate points are:

$A_{10}$ for "$E_0$", point $C_{10}$ for "U", point $D_{10}$ for "O", and point $G_{10}$ for "M";

Point $A_{11}$ for "$\dot{E}_0$", point $C_{11}$ for "$\dot{U}$", and point $D_{11}$ for "O"; segment $A_{11}C_{11}$ for "$\dot{E}_a$";

Point $A_{15}$ for "$E_0$", point $C_{15}$ for "U", and point $D_{15}$ for "O";

wherein the marks move with the moving of the positions of the coordinate points, and the relative positions of the marks and corresponding coordinate points keep constant;

l) wherein the dotted line representing the power angle passes through the center of the rotor, superposing the axial center of the lever, and being not longer than ⅓ of the length of segment $C_{10}D_{10}$ obtained when the synchronous motor is under rating operation; it is marked as "δ" within the range of the power angle, the levers at both sides of the power angle are connected by an arc, the vertex of the arc varies as the positions of the levers vary, the radius of the arc is longer than the radius of the rotor rigid body circle, and the center of the arc superposes the stator axial center;

m) marking the abrupt change of the magnetic excitation potential or the amount of the magnetic excitation adjustment in the composite power angle graph;

n) with respect to a PQ curve in the composite power angle graph: determining the PQ curve according to the end heat-emitting limit of the synchronous motor, the greatest operation power angle of the synchronous motor that the system permits, the greatest active power that the synchronous motor permits, the greatest stator magnetic flux, the greatest stator current and the greatest stator potential that the synchronous motor permits, and the greatest rotor magnetic flux, the greatest rotor current and the greatest rotor voltage that the synchronous motor permits;

o) wherein a composite magnetic leakage alarm circle is depicted by depicting a circle by taking $T_{22}$ as the center of the circle and taking the greatest magnetic leakage flux that the synchronous motor permits as the radius; this circle is the alarm circle, which is represented by a colorful bold curve;

p) wherein the synchronous image requirements are depicted by depicting dotted circles by taking point $D_{15}$ as the center of the circle and taking segments $D_{15}A_{15}$ and $D_{15}C_{15}$ as the radius respectively;

q) wherein the motor mechanical model simulates a real motor to rotate dynamically;

r) wherein an image alarm display is given on electric parameters or magnetic flux, the marks turn to red flickers, the speaker of the computer whistles, and the corresponding segments in the composite power angle graph and its sub-figures and the magnetic leakage graph turn to red flickers; and when the alarm is relieved, the alarm marks or segments stay red but without flicker; and s) wherein in accordance with requirements of the user, adjustments are made within a small range on the stator radius and rotor radius, the axial center radius of the stator and of the rotor, the diameter of the lever and the spring joint radius of the synchronous motor, which are given by the gist of imaging in the composite power angle graph and its sub-figures; the mechanical model graphs are made as three-dimensional mechanical model graphs; and the color of the models is adjusted.

2. The method for measuring the operating state of synchronous motor by using the composite power angle meter according to claim 1, wherein the depicted composite power angle graph of the non-salient-pole synchronous motor has double significations: in one aspect, it represents the electric power angle vector graph of the non-salient-pole synchronous motor, and in another aspect, it represents the mechanical power angle graph showed with the magnetic flux:

(1) wherein the lengths of $OE_0$ and OU represent the magnetic excitation potential and the end voltage of the motor respectively, and $E_0U$, $E_0M$ and UM represent the stator potential of the motor, the active component and reactive component of the stator potential respectively; point M on the segment OU, on the extension of the segment OU or superposing point U represent that the motor generates capacitive reactive power, inductive reactive power or zero reactive power respectively; point $E_0$ above, below or on line OU respectively represent that the motor is a dynamotor, is an electromotor, or has zero active power;

(2) wherein the lengths of $OE_0$ and OU represent the magnetic excitation flux lever and the total magnetic flux lever in the stator coil of the motor respectively, and $E_0U$, $E_0M$ and UM represent the extended length of the mechanical lever spring of the dynamotor, the active component and reactive component of the extended length of the spring respectively; point M on the segment OU, on the extension of the segment OU or superposing point U represent that the motor generates capacitive reactive power, inductive reactive power or zero reactive power respectively; point $E_0$ above or below the lever OU or on the line OU respectively represent that the spring has an anticlockwise torsion, has a clockwise torsion or has no torsion with respect to the stator, and that the motor operates in manner of a dynamotor, an electromotor or zero active power;

(3) wherein the length of $UE_0$ represents the value of the apparent power of the motor, and the lengths of $E_0M$ and UM represent the values of the active power and reactive power of the dynamotor respectively; and (4) wherein the length of $UE_0$ represents the value of the stator current of the motor, and the lengths of $E_0M$ and UM represent the values of the active component and reactive component of the stator current of the motor, respectively.

3. The method for measuring the operating state of synchronous motor by using the composite power angle meter according to claim 1 or 2, wherein in the image coordinates of the motor end composite magnetic leakage graph of the non-salient-pole synchronous motor, Coordinate values of $T_{22}(0, 0)$, $X_{22}(X_1, Y_1)$, $Y_{22}(X_2, Y_2)$, $Z_{22}(X_3, Y_3)$ are:
$X_1=K_1a$; $Y_1=K_1b$; $X_2=K_2(e-a)$; $Y_2=-K_2b$; $X_3=X_1+X_2$; $Y_3=Y_1+Y_2$; and
wherein $K_1$, $K_2$ are prescribed values, and a, b, e are the coordinate values of the electric power angle vector graph of the non-salient-pole synchronous motor.

4. A method for measuring the operating state of synchronous motor by using the composite power angle meter, wherein the method comprises the steps of:

a. using the composite power angle meter to obtain stator voltage and current signals, a magnetic excitation voltage and current signals, a magnetic excitation adjustment signal and a system voltage signal of the synchronous motor in real time;

b. performing internal controlling programs to calculate parameters of the synchronous motor in real time;

c. depicting various electric and mechanical model graphs as well as end composite magnetic leakage graph of the synchronous motor, and displaying the graphs on a display; and wherein the steps for depicting images of composite power angle graph of a salient-pole synchronous motor are:

(1) establishing image coordinates of a composite power angle graph, an electric power angle vector graph, a motor mechanical model graph, a motor mechanical model schematic graph, a synchronous composite power angle graph and a motor end composite magnetic leakage graph of the salient-pole synchronous motor as follows:

Composite power angle graph: $A_0(a, b)$, $B_0(c, d)$, $D_0(0, 0)$, $E_0(f, g)$, $F_0(f, 0)$, $G_0(c, 0)$;

Electric power angle vector graph: $A_1(a, b)$, $C_1(e, 0)$, $D_1(0, 0)$, $E_1(f, g)$;

Motor mechanical model graph: $A_2(a/2, b/2)$, $B_2(c/2, d/2)$, $C_2(e/2, 0)$, $D_2(0, 0)$, $E_2(f/2, g/2)$, $A_3(-a/2, -b/2)$, $B_3(-c/2, -d/2)$, $C_3(-e/2, 0)$, $E_3(-f/2, -g/2)$;

Motor mechanical model schematic graph: $A_4(a, b)$, $B_4(c, d)$, $C_4(e, 0)$, $D_4(0, 0)$, $E_4(f, g)$;

Synchronous composite power angle graph: $A_5(h, i)$, $C_5(j, 0)$, $D_5(0, 0)$;

Motor end composite magnetic leakage graph: $T_{20}(0, 0)$, $X_{20}(X_1, Y_1)$, $Y_{20}(X_2, Y_2)$, $Z_{20}(X_3, Y_3)$;

wherein the electric power angle vector graph is the power angle vector graph of the salient-pole synchronous motor within the electric machine theory; vector vertexes of magnetic excitation potential in the power angle vector graph of the salient-pole synchronous motor have the same planar coordinates as points $A_0$, $A_1$ and $A_4$; vector vertexes of the motor end voltage in the power angle vector graph of the salient-pole synchronous motor have the same planar coordinates as points $C_0$, $C_1$ and $C_4$; vector vertexes of the power angle in the power angle vector graph of the salient-pole synchronous motor have the same planar coordinates as points $D_0$, $D_1$, $D_2$ and $D_4$; coordinates value of point $A_2$ is half of the planar coordinates value of the vector vertex of the magnetic excitation potential in the power angle vector graph of the salient-pole synchronous motor; coordinates value of point $C_2$ is half of the planar coordinates value of the vector vertex of the motor end voltage in the power angle vector graph of the salient-pole synchronous motor; distance between point $A_5$ and point $D_5$ represents synchronous end voltage of the synchronous motor; distance between point $C_5$ and point $D_5$ represents synchronous system voltage;

(2) wherein in a gist of imaging a) the coordinate points in each figure only integrate with the present figure and only image in the present figure, the image moving smoothly;

b) with respect to an axial center of a rigid body of the synchronous motor rotor: depicting circles by taking points $D_0$, $D_2$, $D_4$ and $D_5$ respectively as the center of the circle and taking 1/20 of the length of the segment $C_0D_0$ obtained when the synchronous motor is under rated operation as the radius;

c) with respect to the rigid body of the synchronous motor rotor: depicting circles by taking points $D_0$, $D_2$, $D_4$ and $D_5$ respectively as the center of the circle and taking ¼ of the length of the segment $C_0D_0$ obtained when the synchronous motor is under rating operation as the radius;

d) wherein for a lever of the synchronous motor rotor; the lever is in dark blue, the same color as the rotor rigid body, and the line width of the lever is the same as the diameter of the axial center circle; when the rotor lever is a T-shaped lever, the length of the top beam of the T-shaped lever in each of the composite power angle graph, motor mechanical model schematic graph and synchronous composite power angle graph is two times as much as the length of the segment $D_0C_0$ obtained when the synchronous motor is under rating operation, and the top beam is central-positioned; the length of the top beam of the T-shaped lever in the motor mechanical model graph is two times as much as the length of the segment $D_2C_2$ obtained when the synchronous motor is under rating operation, and the top beam is central-positioned;

Points $D_0$ and $A_0$, points $A_3$ and $A_2$, points $D_4$ and $A_4$ and points $D_5$ and $A_5$ are connected by levers respectively;

e) with respect to the stator rigid body: depicting a circle by taking point $D_2$ as the center of the circle and taking the ⅓ length of the segment $C_0D_0$ obtained when the synchronous motor is under rated operation as the radius;

Points $C_0$ and $D_0$, points $C_4$ and $D_4$, and points $C_5$ and $D_5$ are connected by thin real line respectively, and at both ends of the segments there are prolongations as long as ½ length of the segment $C_0D_0$ obtained when the synchronous motor is under rating operation; the intersection portions with the rotor rigid body circle and the rotor axial center circle are represented by dotted lines; the part under the thin real line is shadowed with parallel thin-short bias, while the rotor rigid body circle and the rotor axial center circle are not shadowed;

f) wherein the stator lever is connected between points $C_2$ and $C_3$ with the same width as that of the rotor lever; points $C_0$ and $D_0$, points $C_4$ and $D_4$, and points $C_5$ and $D_5$ are connected by black bold lines representing levers, the width of the bold line is the radius of the axial center circle, and its intersection portion with the rotor axial center circle and the rotor rigid body circle is represented by thin dotted line;

g) wherein a spring is in black; the spring being visualized to extend and shrink according to the lengthening and shortening of the spring; and wherein there is an obvious joint between the spring and the lever;

Points $B_0$ and $C_0$, points $E_0$ and $C_0$, points $B_2$ and $C_2$, points $E_2$ and $C_2$, points $B_3$ and $C_3$, points $E_3$ and $C_3$, points $B_4$ and $C_4$, and points $E_4$ and $C_4$ are connected with springs respectively;

h) with respect to a joint between the spring and the lever: the joint between the spring and the lever is represented by a white circle, the diameter of the circle is slightly shorter than the diameter of the lever, the circle is positioned at the axial centers of the lever and the spring, and its connection with the spring is obviously visualized; the distances from the center of the circle on top of the lever representing the joint to both sides of the lever equal to the distances from the center to the ends of the lever;

i) wherein in segments, points $E_0$ and $F_0$, points $B_0$ and $G_0$ and points $C_{0\ and\ G0}$ are connected by thin black lines respectively;

j) wherein vectors are depicted linking points $D_1$ and $A_1$ by a segment with an arrow pointing to $A_1$; linking points $E_1$ and $A_1$ by a segment with an arrow pointing to $A_1$; linking points $C_1$ and $E_1$ by a segment with an arrow pointing to $E_1$; linking points $D_1$ and $C_1$ by a segment with an arrow pointing to $C_1$; segment $E_1A_1$ is under segment $D_1A_1$; points $T_{20}$ and $X_{20}$ are linked by a black bold segment with an arrow pointing to $X_{20}$; points $T_{20}$ and $Y_{20}$ are linked by a black bold segment with an arrow pointing to $Y_{20}$; points $T_{20}$ and $Z_{20}$ are linked by a colorful bold segment with an arrow pointing to $Z_{20}$; points $X_{20}$ and $Z_{20}$ and points $Y_{20}$ and $Z_{20}$ are linked by black thin dotted segments respectively;

k) wherein the marks of the coordinate points are:
$A_0$ for "$E_0$", point $B_0$ for "$E_d$", point $C_0$ for "U", and point $D_0$ for "O", point $E_0$ for "$E_q$", point $F_0$ for "M", and point $G_0$ for "N";
Point $A_1$ upper for "$\dot{E}_0$", lower for "$\dot{E}_d$", point $C_1$ for "$\dot{U}$", point $D_1$ for "O", and point $E_1$ for "$\dot{E}_q$";
Point $A_5$ for "$E_0$", point $C_5$ for "U", and point $D_5$ for "O"; and
wherein the marks move with the moving of the positions of the coordinate points, and the relative positions of the marks and corresponding coordinate points keep constant;

1) wherein the dotted line representing the power angle passes through the center of the rotor, superposing the axial center of the lever, and being not longer than ⅓ of the length of segment $C_0D_0$ obtained when the synchronous motor is under rating operation; it is marked as "δ" within the range of the power angle, the levers at both sides of the power angle are connected by an arc, the vertex of the arc varies as the positions of the levers vary, the radius of the arc is longer than the radius of the rotor rigid body circle, and the center of the arc superposes the stator axial center;

m) marking the abrupt change of the magnetic excitation potential or the amount of the magnetic excitation adjustment in the composite power angle graph;

n) with respect to a PQ curve in the composite power angle graph: determining the PQ curve according to the end heat-emitting limit of the synchronous motor, the greatest operation power angle of the synchronous motor that the system permits, the greatest active power that the synchronous motor permits, the greatest stator magnetic flux, the greatest stator current and the greatest stator potential that the synchronous motor permits, the greatest rotor magnetic flux, the greatest rotor current and the greatest rotor voltage that the synchronous motor permits;

o) wherein a composite magnetic leakage alarm circle is depicted by depicting a circle by taking $T_{20}$ as the center of the circle and taking the greatest magnetic leakage flux that the synchronous motor permits as the radius; this circle is the alarm circle, which is represented by a colorful bold curve;

p) wherein the synchronous image requirements are depicted by depicting dotted circles by taking point $D_5$ as the center of the circle and taking segments $D_5A_5$ and $D_5C_5$ as the radius respectively;

q) wherein the motor mechanical model simulates a real motor to rotate dynamically;

r) wherein an image alarm display is given on electric parameters or magnetic flux, the marks turn to red flickers, the speaker of the computer whistles, and the corresponding segments in the composite power angle graph and its sub-figures and the end composite magnetic leakage graph turn to red flickers; and when the alarm is relieved, the alarm marks or segments stay red but without flicker; and s) wherein in accordance with requirements of the user, adjustments are made on the stator radius and rotor radius, the axial center radius of the stator and of the rotor, the diameter of the lever and the spring joint radius of the synchronous motor, which are given by the gist of imaging in the composite power angle graph and its sub-figures; the mechanical model graphs are made as three-dimensional mechanical model graphs; and the color of the models is adjusted.

5. The method for measuring the operating state of synchronous motor by using the composite power angle meter according to claim 4, wherein the depicted composite power angle graph of the salient-pole synchronous motor has double significations: in one aspect, it represents the electric power angle vector graph of the salient-pole synchronous motor, and in another aspect, it represents the mechanical power angle graph showed with the magnetic flux:

(1) wherein the lengths of $OE_0$ and OU represent the magnetic excitation potential and the end voltage of the dynamotor respectively, $UE_q$ and $UE_d$ represent the quadrature-axis component and direct-axis component of the stator potential of the synchronous motor respectively, and $E_qM$ and MU represent the active component and reactive component of the stator quadrature-axis potential of the synchronous motor, point M on segment OU or superposing point U respectively represent that the inductive reactive power done by the quadrature-axis potential is negative or zero, point $E_q$ above, below or on the line OU respectively represent that the active power done by the quadrature-axis potential is positive, negative or zero; $E_dN$ and NU represent the active component and reactive component done by the stator direct-axis potential of the synchronous motor respectively, point N on the segment OU, on the extension of the segment OU or superposing point U respectively represent that the inductive reactive power done by the direct-axis potential is negative, positive or zero, and point $E_d$ above, below or on the line OU respectively represent that the active power done by direct-axis potential is positive, negative or zero;

(2) wherein the lengths of $OE_0$ and OU represent the magnetic excitation flux and the total composite magnetic flux in the stator coil of the dynamotor respectively, $UE_q$ and $UE_d$ respectively represent the quadrature-axis component and direct-axis component of the composite magnetic flux generated by the reaction of the stator armature of the synchronous motor; and (3) wherein the lengths of $OE_0$ and OU represent the rotor lever and stator lever of the synchronous motor respectively, $UE_q$ and $UE_d$ respectively represent the extended lengths of the springs by which the rotor lever of the synchronous motor pulls the stator lever along directions of quadrature-axis and direct-axis, and segments $E_qM$ and $E_dN$ respectively represent the active length components generated by the extensions of the quadrature-axis spring and direct-axis spring, anticlockwise and clockwise pulls generate positive active power and negative active power respectively, segments MU and UN respectively represent the reactive components generated by the extensions of the quadrature-axis spring and direct-axis spring, the pull along the direction from point O to point U generates positive inductive reactive power, and the pull along the direction from point U to point O generates the negative inductive reactive power.

6. The method for measuring the operating state of synchronous motor by using the composite power angle meter according to claim 4 or 5, wherein in the image coordinates of the motor end composite magnetic leakage graph of the salient-pole synchronous motor, Coordinate values of $T_{20}(0, 0)$, $X_{20}(X_1, Y_1)$, $Y_{20}(X_2, Y_2)$, $Z_{20}(X_3, Y_3)$ are:

$X_1=K_1 a$; $Y_1=K_1 b$; $X_2=K_2(f-a)+K_3(c-a)$; $Y_2=K_2(g-b)+K_3(d-b)$; $X_3=X_1+X_2$; $Y_3=Y_1+Y_2$; and Wherein $K_1$, $K_2$, $K_3$ are prescribed values, and a, b, c, d, f, g are the coordinate values of the electric power angle vector graph of the salient-pole synchronous motor.

* * * * *